United States Patent
Ando et al.

(10) Patent No.: US 10,932,353 B2
(45) Date of Patent: Feb. 23, 2021

(54) ANTENNA FOR GENERATING PLASMA, AND PLASMA TREATMENT DEVICE AND ANTENNA STRUCTURE PROVIDED WITH ANTENNA FOR GENERATING PLASMA

(71) Applicant: NISSIN ELECTRIC CO., LTD., Kyoto (JP)

(72) Inventors: Yasunori Ando, Kyoto (JP); Dongwei Li, Kyoto (JP); Kiyoshi Kubota, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 16/485,166

(22) PCT Filed: Feb. 13, 2018

(86) PCT No.: PCT/JP2018/004939
§ 371 (c)(1),
(2) Date: Aug. 12, 2019

(87) PCT Pub. No.: WO2018/151114
PCT Pub. Date: Aug. 23, 2018

(65) Prior Publication Data
US 2019/0373710 A1 Dec. 5, 2019

(30) Foreign Application Priority Data

Feb. 16, 2017 (JP) .............................. JP2017-026663
Mar. 15, 2017 (JP) .............................. JP2017-050566
(Continued)

(51) Int. Cl.
*H05H 1/46* (2006.01)
*H01J 37/32* (2006.01)

(52) U.S. Cl.
CPC ......... *H05H 1/46* (2013.01); *H01J 37/32091* (2013.01); *H01J 37/32174* (2013.01); *H05H 2001/463* (2013.01)

(58) Field of Classification Search
None
See application file for complete search history.

(56) References Cited

U.S. PATENT DOCUMENTS

2002/0189763 A1* 12/2002 Kwon .................. H01J 37/321
156/345.48
2005/0067934 A1    3/2005 Ueda et al.
(Continued)

FOREIGN PATENT DOCUMENTS

JP    H11117095    4/1999
JP    2002510841   4/2002
(Continued)

OTHER PUBLICATIONS

"International Search Report (Form PCT/ISA/210) of PCT/JP2018/004939," dated Apr. 24, 2018, with English translation thereof, pp. 1-4.
(Continued)

*Primary Examiner* — Amy Cohen Johnson
*Assistant Examiner* — James H Cho
(74) *Attorney, Agent, or Firm* — JCIPRNET

(57) ABSTRACT

The impedance of an antenna is reduced and gaps generated between electrodes constituting a capacitance element and a dielectric body are eliminated. An antenna (3) for generating inductively coupled plasma P includes at least two conductor elements (31), an insulation element (32) that is arranged between the mutually adjacent conductor elements (31) and insulates the conductor elements (31), and a capacitance element (33) that is connected electrically to and in series with the mutually adjacent conductor elements (31). The
(Continued)

capacitance element (33) is configured from a first electrode (33A) electrically connected to one of the mutually adjacent conductor elements (21), a second electrode (33B) electrically connected to the other of the mutually adjacent conductor elements (21), and a liquid dielectric body filling the space between the first electrode (33A) and the second electrode (33B).

25 Claims, 18 Drawing Sheets

(30) Foreign Application Priority Data

Oct. 24, 2017 (JP) .............................. JP2017-204961
Oct. 24, 2017 (JP) .............................. JP2017-204967

(56) References Cited

U.S. PATENT DOCUMENTS

| | | | | |
|---|---|---|---|---|
| 2008/0138992 | A1* | 6/2008 | DiVergilio | H01J 37/321 438/710 |
| 2008/0168945 | A1* | 7/2008 | Kim | H01J 37/32082 118/723 I |
| 2011/0018443 | A1 | 1/2011 | Kou et al. | |
| 2016/0099130 | A1* | 4/2016 | Ando | H01J 37/3211 315/111.21 |

FOREIGN PATENT DOCUMENTS

| | | |
|---|---|---|
| JP | 2013206652 | 10/2013 |
| JP | 2016072168 | 5/2016 |
| KR | 20020096259 | 12/2002 |
| KR | 20160039558 | 4/2016 |
| WO | 2009142016 | 11/2009 |

OTHER PUBLICATIONS

Office Action of Korea Counterpart Application, with English translation thereof, dated May 25, 2020, pp. 1-23.
"Office Action of Korea Counterpart Application" with English translation thereof, dated Oct. 8, 2020, p. 1-p. 6.

* cited by examiner

ANTENNA FOR GENERATING PLASMA, AND PLASMA TREATMENT DEVICE AND ANTENNA STRUCTURE PROVIDED WITH ANTENNA FOR GENERATING PLASMA

CROSS-REFERENCE TO RELATED APPLICATION

This application is a 371 of international application of PCT application serial no. PCT/JP2018/004939, filed on Feb. 13, 2018, which claims the priority benefit of Japan applications no. 2017-026663, filed on Feb. 16, 2017, no. 2017-050566, filed on Mar. 15, 2017, no. 2017-204961, filed on Oct. 24, 2017, and no. 2017-204967, filed on Oct. 24, 2017. The entirety of each of the abovementioned patent applications is hereby incorporated by reference herein and made a part of this specification.

BACKGROUND OF THE INVENTION

Technical Field

The present invention relates to an antenna through which a high-frequency current flows to generate inductively coupled plasma, and to a plasma treatment device and an antenna structure provided with the antenna.

Related Art

A plasma treatment device has been proposed before in which a high-frequency current flows in an antenna and an induced electric field is generated accordingly, inductively coupled plasma (referred to as "ICP" for short) is generated by the induced electric field and the inductively coupled plasma is used to perform a treatment on a substrate W.

In this type of plasma treatment device, when the antenna is lengthened to deal with large substrates or the like, the impedance of the antenna increases, and a large potential difference is generated accordingly between two ends of the antenna. As a result, there are problems that under the influence of the large potential difference, the uniformity of the plasma such as density distribution, potential distribution, electron temperature distribution or the like of the plasma deteriorates, and the uniformity of substrate treatment deteriorates. In addition, when the impedance of the antenna increases, there is also a problem that it is hard for the high-frequency current to flow through the antenna.

In order to solve the problems, as shown in patent literature 1, the following plasma treatment device is considered in which a plurality of metal pipes is connected with hollow insulators interposed between adjoining metal pipes, and capacitors which are capacitance elements are disposed on outer periphery portions of the hollow insulators. The capacitor is connected electrically to and in series with the metal pipes on two sides of the hollow insulator, and has a first electrode electrically connected to the metal pipe on one side of the hollow insulator, a second electrode overlapping the first electrode and electrically connected to the metal pipe on the other side of the hollow insulator, and a dielectric sheet disposed between the first electrode and the second electrode.

LITERATURE OF RELATED ART

Patent Literature

Patent literature 1: Japanese Laid-Open No. 2016-72168

SUMMARY

Problems to be Solved

However, because the aforementioned capacitor is a laminated structure of the first electrode, the dielectric sheet and the second electrode, gaps may be generated between the electrodes and the dielectric bodies. Then, with the consideration that arc discharge may be generated in the gaps and lead to deterioration of the capacitors, there is room for improvement of the structure of the capacitor.

Here, in order that no gap is generated between the electrodes and the dielectric bodies, it is considered to coat two surfaces of the dielectric body sheet by an adhesive to bond the electrodes. However, electrical performances of the adhesive change the performances of the dielectric body sheet and it is hard to obtain required capacitance values and the like.

Moreover, it is also considered to arrange a structure that presses the gaps from the surrounding to fill the gaps generated between the electrodes and the dielectric bodies. However, due to the arrangement of the pressing structure, the structure around the antenna becomes complicated and the uniformity of the plasma generated in the surrounding may deteriorate.

Therefore, the present invention is accomplished to solve the problems above, and the main purpose is to incorporate capacitance elements into an antenna to reduce the impedance of the antenna, and to eliminate gaps generated between electrodes constituting a capacitance element and a dielectric body.

Means to Solve Problems

That is, the antenna for generating plasma of the present invention is an antenna through which a high-frequency current flows to generate plasma and which includes: at least two conductor elements; an insulation element that is arranged between mutually adjacent conductor elements and insulates the conductor elements; and a capacitance element connected electrically to and in series with the mutually adjacent conductor elements; the capacitance element includes: a first electrode electrically connected to one of the mutually adjacent conductor elements; a second electrode electrically connected to the other of the mutually adjacent conductor elements and disposed opposing the first electrode; and a dielectric body filling the space between the first electrode and the second electrode; the dielectric body is a liquid.

According to the aforementioned antenna for generating plasma, the capacitance element is connected electrically to and in series with the conductor elements being mutually adjacent via the insulation element, and thus the synthetic reactance of the antenna, in short, becomes the form of subtracting the capacitive reactance from the inductive reactance, and thus the impedance of the antenna can be reduced. As a result, even when the antenna is lengthened, an increase in the impedance can be suppressed, the high-frequency current flows easily through the antenna, and the plasma can be efficiently generated.

In particular, according to the present invention, because the space between the first electrode and the second electrode is filled with the liquid dielectric body, the gaps generated between the electrodes constituting the capacitance element and the dielectric body can be eliminated. As a result, the arc discharge that may occur in the gaps between the electrodes and the dielectric body can be eliminated, and damage of the capacitance element caused by arc discharge can be eliminated. In addition, the capacitance value can be set with high precision from the distance and opposing area of the first electrode and the second electrode, and the relative permittivity of the liquid dielectric body, without considering the gaps. Furthermore, the structure that presses the electrodes and the dielectric body to fill the gaps can also be omitted, and complication of the structure around the antenna caused by the pressing structure and deterioration in the uniformity of the plasma generated accordingly can be prevented.

In order to further simplify the surrounding structure of the antenna to improve the uniformity of the plasma, desirably, the insulation element is formed into a tubular shape, and the capacitance element is arranged inside the insulation element.

In order to cool the antenna to stably generate the plasma, it is considered to form the conductor elements and the insulation element into a tubular shape to get a cooling liquid to circulate inside the conductor elements and the insulation element. In this configuration, desirably, the cooling liquid is supplied to the space between the first electrode and the second electrode, and the cooling liquid is used as the dielectric body. By using the cooling liquid as the dielectric body, it is unnecessary to prepare a dielectric body independently from the cooling liquid, and the first electrode and the second electrode can be cooled. Usually, the cooling liquid is adjusted to a fixed temperature by a temperature adjusting mechanism, and by using the cooling liquid as the dielectric body, the change in relative permittivity caused by temperature change can be suppressed, and the change in capacitance value can be suppressed. Furthermore, when water is used as the cooling liquid, because the relative permittivity of water is about 80 (20° C.) and is greater than the relative permittivity of the dielectric sheet made of resin, a capacitance element that can withstand a high voltage can be configured.

As a specific embodiment of each electrode, desirably, each of the electrodes has a flange portion in electrical contact with an end portion of the conductor element on the insulation element side, and an extending portion that extends from the flange portion toward the insulation element side.

According to this configuration, a contacting area with the conductor elements can be enlarged by the flange portion, and an opposing area between the electrodes can be set by the extending portion.

Desirably, the extending portion of each of the electrodes is formed into a tubular shape and is arranged coaxially with each other.

According to this configuration, the opposing area between the electrodes can be enlarged, and the distribution of the high-frequency current flowing through the conductor elements can be homogenized in a circumferential direction to generate plasma with high uniformity.

Desirably, the flange portion of each of the electrodes is fitted into a concave portion formed on a side peripheral wall of the insulation element.

According to this configuration, by fitting the flange portion into the concave portion of the insulation element, the relative position of the extending portion of each electrode can be determined, and the assembling can be easy.

In addition, the antenna for generating plasma of the present invention is an antenna through which a high-frequency current flows to generate plasma and which includes: at least two conductor elements; an insulation element that is arranged between and insulates a first conductor element and a second conductor element which are mutually adjacent; and a capacitance element connected electrically to and in series with the first conductor element and the second conductor element; the capacitance element includes: a first electrode, which is an electrode consisting of a part of the first conductor element or an electrode electrically connected to the first conductor element, and which is disposed nearer to the first conductor element side than the insulation element; a second electrode, which is electrically connected to the second conductor element, and which extends from the second conductor element side to the first conductor element side through the inside of the insulation element and is disposed opposing the first electrode; and a dielectric body filling the space between the first electrode and the second electrode; and the dielectric body is a liquid.

According to the aforementioned antenna for generating plasma, because the capacitance element is connected electrically to and in series with the mutually adjacent conductor elements arranged via the insulation element, the synthetic reactance of the antenna, in short, becomes the form of subtracting the capacitive reactance from the inductive reactance, and thus the impedance of the antenna can be reduced. As a result, even when the antenna is lengthened, the increase in the impedance can be suppressed, the high-frequency current flows easily through the antenna, and the plasma can be efficiently generated.

In particular, according to the present invention, because the space between the first electrode and the second electrode is filled with the liquid dielectric body, the gaps generated between the electrodes constituting the capacitance element and the dielectric body can be eliminated. As a result, the arc discharge to be generated in the gaps between the electrodes and the dielectric body can be eliminated, and damage of the capacitance element caused by arc discharge can be eliminated. In addition, the capacitance value can be set with high precision from the distance and opposing area of the first electrode and the second electrode, and the relative permittivity of the liquid dielectric body, without considering the gaps. Furthermore, the structure that presses the electrodes and the dielectric body to fill the gaps can also be omitted, and complication of the structure around the antenna caused by the pressing structure and deterioration in the uniformity of the plasma generated accordingly can be prevented. Additionally, because the second electrode is made to oppose the first electrode by extending the second electrode from the second conductor element side to the first conductor element side through the inside of the insulation element, the capacitance value required for the capacitance element can be easily obtained by changing the extending dimension of the second electrode.

An embodiment for simplifying the structure of the capacitance element may be a configuration in which the first electrode is formed into a tubular shape and the second electrode has an extending portion that is inserted into an inner space of the first electrode.

Desirably, a distance between an internal circumferential surface of the first electrode and an external circumferential surface of the extending portion is fixed along the circumferential direction.

According to this configuration, the distribution of the high-frequency current flowing through the conductor elements can be homogenized in the circumferential direction to generate plasma with high uniformity.

In order to cool the antenna to stably generate the plasma, it is considered to form each of the conductor elements into a tubular shape to get a cooling liquid to circulate inside each of the conductor elements. In this configuration, desirably, the cooling liquid flowing inside the first conductor element flows into the space between the first electrode and the second electrode to functions as the dielectric body, and is introduced into the second electrode from one or a plurality of through hole(s) formed on the second electrode to flow into the second conductor element.

According to the aforementioned configuration, by using the cooling liquid as the dielectric body, it is unnecessary to prepare a dielectric body independently from the cooling liquid, and the first electrode and the second electrode can be cooled. Usually, the cooling liquid is adjusted to a fixed temperature by a temperature adjusting mechanism, and by using the cooling liquid as the dielectric body, the change in relative permittivity caused by temperature change can be suppressed, and the change in capacitance value can be suppressed. Furthermore, when water is used as the cooling liquid, because the relative permittivity of water is about 80 (20° C.) and is greater than the relative permittivity of the dielectric sheet made of resin, a capacitance element that can withstand a high voltage can be configured.

In the aforementioned configuration, that is, in the configuration in which the through hole is arranged on the second electrode and the cooling liquid is introduced into the second electrode from the through hole, in order to reduce the resistance to the flowing of the cooling liquid, desirably, in the second electrode, one or a plurality of groove(s) which communicates with the through holes and extends along a flow direction of the cooling liquid is formed.

There is concern that the capacitance value of each of the electrodes made of metal and constituting the capacitance element changes over time because of oxidation. As a result, the state of the plasma generated by the change of the impedance of the antenna also changes, and film quality or uniformity of film-forming changes over time. In order to appropriately solve the problem, desirably, each of the electrodes has a corrosion resistant layer at least on mutually opposing surfaces of each of the electrodes.

Here, it is considered that the corrosion resistant layer may be a plating film or a surface oxide film of the first electrode and the second electrode.

In addition, the plasma treatment device of the present invention includes a vacuum container which is evacuated and into which gas is introduced, an antenna disposed inside the vacuum container or outside the vacuum container, and a high-frequency power source which flows a high-frequency current in the antenna; the plasma treatment device is configured to use plasma generated by the antenna to perform a treatment on a substrate, and the antenna has the aforementioned configuration.

According to the plasma treatment device, plasma with high uniformity can be efficiently generated by the antenna, and thus the uniformity and efficiency of a substrate treatment can be improved.

In order to perform the treatment on a large-area substrate in the plasma treatment device, it is considered to include a plurality of the antennas in the plasma treatment device. In this case, desirably, two end portions of the antenna extend to the outside of the vacuum container, and in the mutually adjacent antennas, the end portion of one of the antennas and the end portion of the other of the antennas are electrically connected by a connection conductor, and high-frequency currents with mutually opposite directions flow in the mutually adjacent antennas.

Desirably, the connection conductor has a flow path inside, and a cooling liquid flows in the flow path.

Desirably, the cooling liquid flows inside the conductor elements and the insulation element, and in the mutually adjacent antennas, the cooling liquid flowing through one of the antennas flows to the other of the antennas through the flow path of the connection conductor.

According to this configuration, both the antennas and the connection conductor can be cooled by a shared cooling liquid. In addition, because a plurality of antennas can be cooled by one flow path, the structure of the circulation flow path in which the cool liquid is circulated can be simplified. Moreover, when the flow path of the antenna and the flow path of the connection conductor are long, the permittivity on the downstream side may decrease due to the temperature rise of the cooling liquid. Therefore, the number of the antennas connected by the connection conductor is set with consideration of the temperature rising degree of the cooling liquid, for example, the number of the antennas is about four.

When power-feeding side end portions and grounded side end portions of two antennas are connected by the connection conductor, an increase in impedance caused by the connection conductor is generated. As a result, due to energization of the high-frequency current, the electrical potential of the end portion nearest to the power-feeding side may rise with respect to the end portion nearest to the grounded side, or the voltage may rise or fall due to the impedance of the connection conductor. This is the cause for the non-uniformity of the plasma that is generated.

In order to appropriately solve this problem, desirably, the connection conductor has one conductor portion connected to one antenna in the mutually adjacent antennas, the other conductor portion connected to the other antenna, and a capacitance element connected electrically to and in series with the one conductor portion and the other conductor portion. By arranging the capacitance element in the connection conductor in this way, the impedance of the connection conductor can be made to be equivalent to zero, and an increase in impedance caused by the connection conductor can be eliminated.

In the plasma treatment device, from the purpose of suppressing charged particles in the plasma from being incident on the conductor elements constituting the antenna, a configuration is considered in which an insulation cover that covers the antenna is arranged. At this time, when the antenna is lengthened due to the configuration of the aforementioned antenna, the antenna is bent and the insulation element comes into contact with the insulation cover which has a high temperature due to the plasma. When the insulation element is made of resin, the problem of thermal damage is particular remarkable.

In order to appropriately solve this problem, desirably, a convex portion that protrudes toward the insulation cover is formed on an outer circumferential surface of at least one of the first conductor element and the second conductor element.

According to this configuration, even when the antenna is bent, the insulation element can be prevented from coming into contact with the insulation cover by the contact between the convex portion and the insulation cover. Accordingly, the thermal damage of the insulation element can be prevented. In addition, by preventing the contact between the insulation element and the insulation cover, the temperature of the cooling liquid which becomes the dielectric body of the capacitance element can be prevented from increasing due to the contact between the insulation element and the insulation cover. As a result, a permittivity change of the cooling liquid can be suppressed.

In order to reliably prevent the contact between the insulation element and the insulation cover, desirably, the convex portion is continuously or intermittently formed along the entire circumferential direction of the outer circumferential surface. In addition, the contacting area between the convex portion and the insulation cover can be enlarged by this configuration, and the load to the insulation cover can be dispersed.

In order to reliably prevent the contact between the insulation element and the insulation cover, desirably, the convex portion is formed in a position adjoining the insulation element in the outer circumferential surface of the first conductor element and the second conductor element.

In addition, the antenna structure of the present invention includes the aforementioned antenna, and an insulation cover that covers the antenna, and a convex portion that protrudes toward the insulation cover is formed on the outer circumferential surface of at least one of the first conductor element and the second conductor element.

Furthermore, the plasma treatment device of the present invention includes a treatment chamber which is evacuated and to which gas is introduced, the above antenna disposed outside the treatment chamber, and a high-frequency power source in which a high-frequency current flows through the antenna; and the plasma treatment device is configured to use the plasma generated by the antenna to perform a treatment on a substrate inside the treatment chamber.

According to the plasma treatment device, the conditions such as the pressure of the treatment chamber and the conditions such as the pressure of an antenna chamber where the antenna is disposed can be controlled independently, the plasma can be generated efficiently and the substrate can be treated efficiently.

In order to perform a treatment on a large-area substrate in the plasma treatment device, desirably, a plurality of the antennas are included, and the end portion of one antenna in the mutually adjacent antennas and the end portion of the other antenna are electrically connected by a connection conductor, and high-frequency currents with mutually opposite directions flow in the mutually adjacent antennas.

Furthermore, the antenna structure of the present invention includes an antenna through which a high-frequency current flows to generate plasma, and an insulation cover which covers the antenna; the antenna includes at least two conductor elements, an insulation element that is disposed between and insulates a first conductor element and a second conductor element which are mutually adjacent, and a capacitance element connected electrically to and in series with the first conductor element and the second conductor element; the capacitance element includes a first electrode electrically connected to one of the mutually adjacent conductor elements, a second electrode electrically connected to the other of the mutually adjacent conductor elements and disposed opposing the first electrode, and a dielectric body filling the space between the first electrode and the second electrode; the dielectric body is a liquid, and a convex portion that protrudes toward the insulation cover is formed on the outer circumferential surface of at least one of the first conductor element and the second conductor element.

Effect

According to the present invention described above, by incorporating the capacitance element into the antenna, the impedance of the antenna can be reduced, and gaps generated between the electrodes constituting the capacitance element and the dielectric body can be eliminated, and thus the plasma with high uniformity can be efficiently generated.

Figure 1:
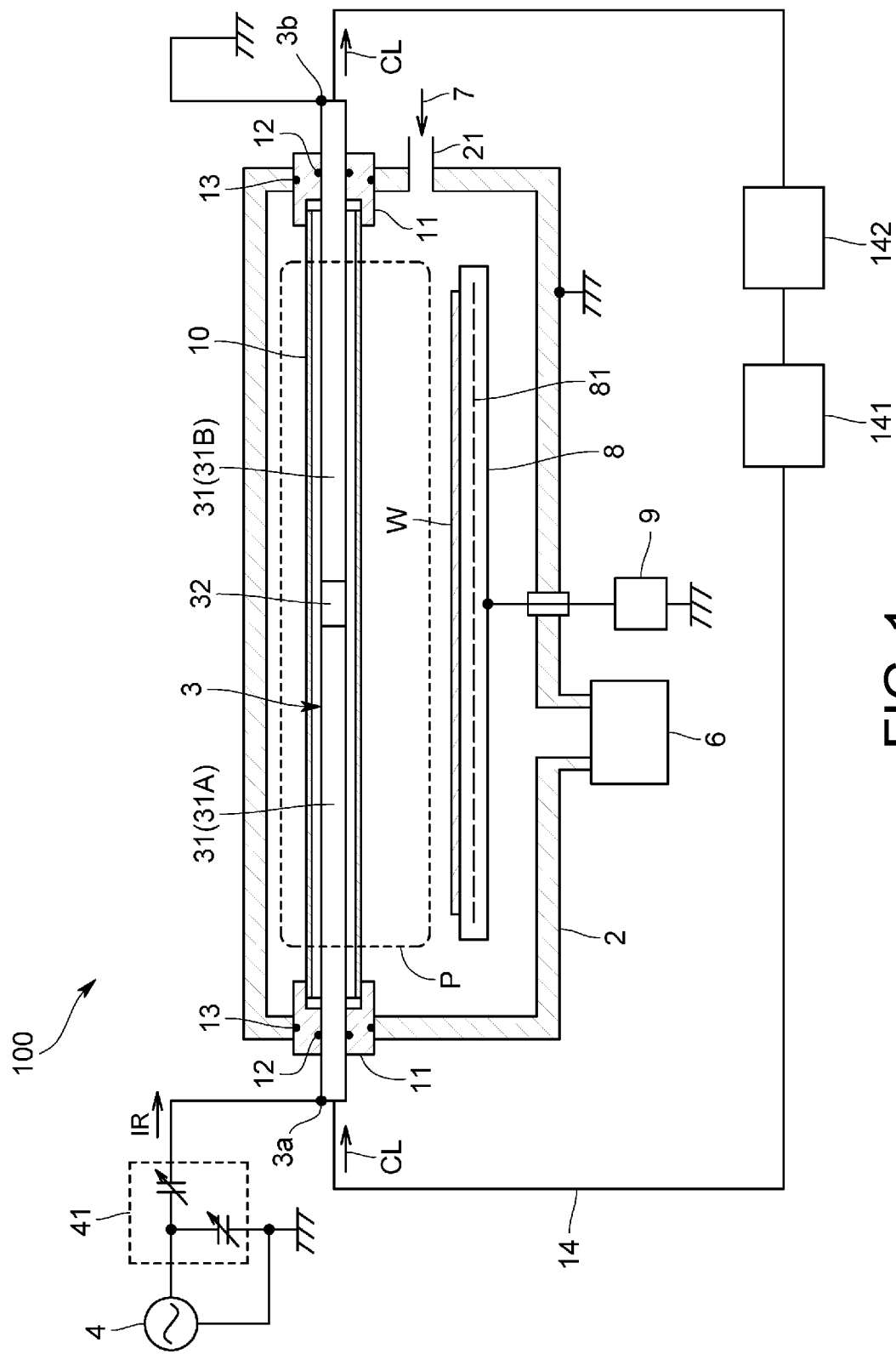
FIG. 1 is a longitudinal sectional view which schematically shows a configuration of a plasma treatment device of a first embodiment.

DESCRIPTION OF THE SYMBOLS 100 plasma treatment device
W substrate
P inductively coupled plasma
2 vacuum container
3 antenna
31 metal pipe (conductor element)
32 insulation pipe (insulation element)
32b concave portion
33 capacitor
33A first electrode 33B second electrode
331 flange portion
332 extending portion
CL cooling liquid (liquid dielectric body)
4 high-frequency power source
17 connection conductor
17a one conductor portion
17b the other conductor portion
17c capacitance element
18 treatment chamber

DESCRIPTION OF THE EMBODIMENTS

1. First Embodiment

In the following, a first embodiment of a plasma treatment device of the present invention is described with reference to the drawings.

Device Configuration

A plasma treatment device 100 of this embodiment uses inductively coupled plasma P to perform a treatment on a substrate W. Here, the substrate W is, for example, a substrate for a flat panel display (FPD) such as a liquid-crystal display, an organic EL display and the like, a flexible substrate for a flexible display, or the like. In addition, the treatment performed on the substrate W is, for example, film-forming by plasma CVD method, etching, ashing, sputtering or the like.

Moreover, the plasma treatment device 100 is also called a plasma CVD device when performing film forming by the plasma CVD method, called a plasma etching device when performing etching, called a plasma ashing device when performing ashing, and called a plasma sputtering device when performing sputtering.

Specifically, as shown in FIG. 1, the plasma treatment device 100 includes a vacuum container 2 which is evacuated and to which a gas 7 is introduced, a linear antenna 3 disposed inside the vacuum container 2, and a high-frequency power source 4 which applies to the antenna 3 a high frequency for generating inductively coupled plasma P within the vacuum container 2. Moreover, by applying a high frequency to the antenna 3 from the high-frequency power source 4, a high-frequency current IR flows through the antenna 3, and an induced electric field is generated within the vacuum container 2 and the inductively coupled plasma P is generated.

The vacuum container 2 is a container made of metal for example, and the inside of the vacuum container 2 is evacuated by an evacuation device 6. In this example, the vacuum container 2 is electrically grounded.

The gas 7 is introduced into the vacuum container 2 via, for example, a flow regulator (not shown) and a plurality of gas introduction ports 21 disposed in a direction along the antenna 3. The gas 7 may be any gas as long as it corresponds to the content of the treatment performed on the substrate W. For example, when film forming is performed on the substrate W by the plasma CVD method, the gas 7 is a source gas or a gas obtained by diluting the source gas by a dilution gas (for example, $H_2$). More specifically, when the source gas is $SiH_4$, a Si film can be formed on the substrate W, when the source gas is $SiH_4+NH_3$, a SiN film can be formed on the substrate W, when the source gas is $SiH_4+O_2$, a $SiO_2$ film can be formed on the substrate W, and when the source gas is $SiF_4+N_2$, a SiN:F film (fluorinated silicon nitride film) film can be formed on the substrate W.

In addition, a substrate holder 8 that holds the substrate W is arranged inside the vacuum container 2. As shown in this example, a bias voltage may be applied to the substrate holder 8 from a bias power source 9. The bias voltage is, but not limited to, for example, a negative direct-current voltage, a negative bias voltage and the like. By the bias voltage, for example, the energy when positive ions in the plasma P are incident on the substrate W can be controlled to control the crystallinity degree of the film formed on the surface of the substrate W, or the like. A heater 81 for heating the substrate W may be arranged in the substrate holder 8.

The antenna 3 is disposed above the substrate W in the vacuum container 2 along the surface of the substrate W (for example, substantially parallel to the surface of the substrate W). There may be one or a plurality of antenna(s) 3 disposed in the vacuum container 2.

The vicinities of two end portions of the antenna 3 respectively penetrate mutually opposing side walls of the vacuum container 2. In the part of the antenna 3 where the two end portions are made to penetrate outward the vacuum container 2, insulate members 11 are arranged respectively. The two end portions of the antenna 3 penetrate respective insulate members 11, and the penetrating portion is vacuum sealed by a packing 12 for example. The space between each insulate member 11 and the vacuum container 2 is also vacuum sealed by a packing 13 for example. Moreover, the material of the insulate members 11 is, for example, ceramic such as alumina, quartz, or an engineering plastic such as polyphene sulfide (PPS), polyether ether ketone (PEEK) or the like.

Furthermore, in the antenna 3, the part located inside the vacuum container 2 is covered by a straight tubular insulation cover 10. Two end portions of the insulation cover 10 are supported by the insulate members 11. Moreover, the space between the insulate members 11 and the two end portions of the insulation cover 10 may not be sealed. The reason is that, even if the gas 7 enters the space inside the insulation cover 10, usually, the plasma P will not be generated in the space because the space is small and moving distances of electrons are short. Moreover, the material of the insulation cover 10 is, for example, quartz, alumina, fluorine resin, silicon nitride, silicon carbide, silicon and the like.

By arranging the insulation cover 10, the charged particles in the plasma P can be prevented from being incident on a metal pipe 31 constituting the antenna 3, and thus an increase in plasma potential caused by the incidence of the charged particles (mainly electrons) on the metal pipe 31 can be suppressed, and the situation that the metal pipe 31 is sputtered by the charged particles (mainly ions) and metal contamination is generated on the plasma P and the substrate W can be suppressed.

The high-frequency power source 4 is connected to a power-feeding end portion 3a which is one end portion of the antenna 3 via a matching circuit 41, and a terminal portion 3b which is the other end portion is directly grounded. Moreover, the terminal portion 3b may be grounded via a capacitor, a coil or the like.

By the aforementioned configuration, the high-frequency current IR can flow from the high-frequency power source 4 to the antenna 3 via the matching circuit 41. The frequency of the high frequency is generally 13.56 MHz for example, but the frequency is not limited hereto.

Figure 2:
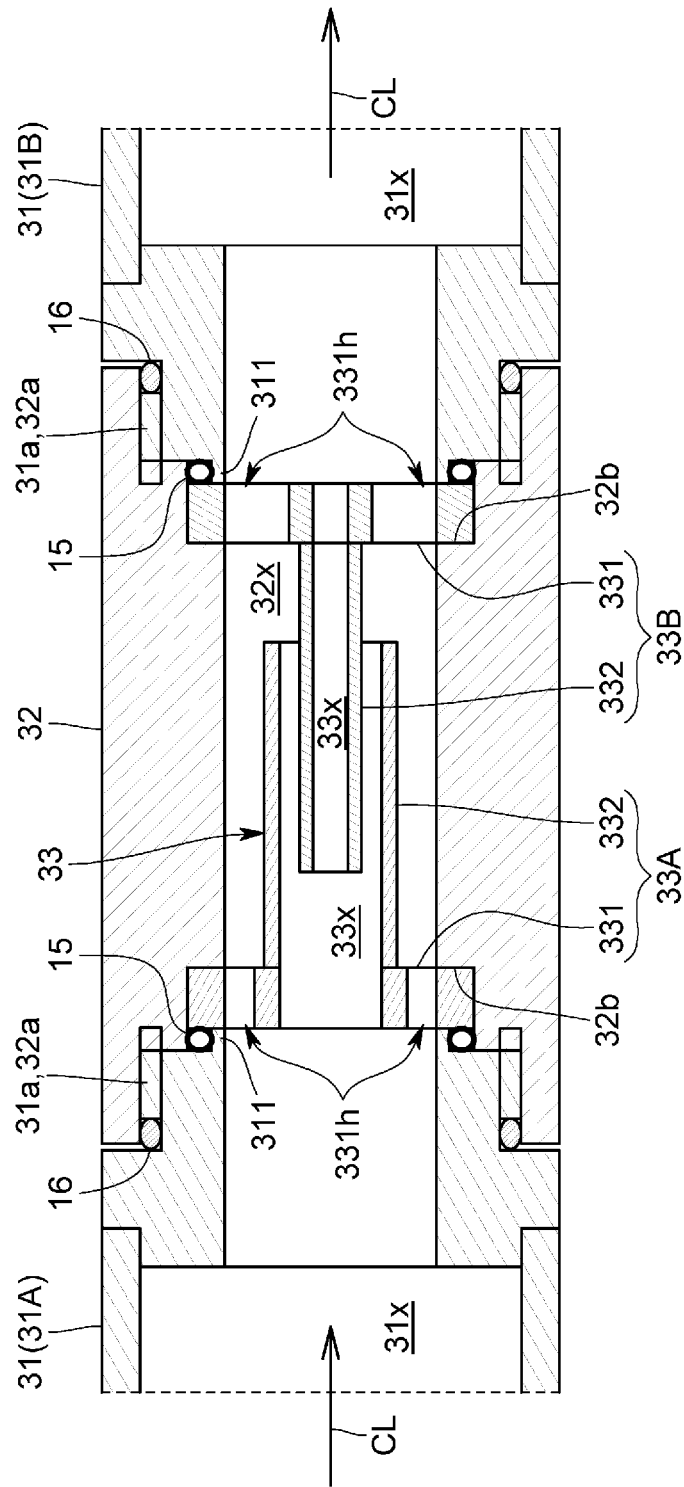
FIG. 2 is an enlarged sectional view which schematically shows a surrounding structure of a capacitance element in an antenna of the first embodiment.

The antenna 3 is a hollow structure inside which there is a flow path for a cooling liquid CL to circulate. Specifically, as shown in FIG. 2, the antenna 3 includes at least two tubular conductor elements 31 made of metal (referred to as "metal pipes 31" hereinafter), a tubular insulation element 32 (referred to as "insulation pipe 32" hereinafter) that is arranged between mutually adjacent metal pipes 31 and insulates the metal pipes 31, and a capacitor 33 which is a capacitance element connected electrically to and in series with the mutually adjacent metal pipes 31.

In this embodiment, there are two metal pipes 31 and respectively one insulation pipe 32 and one capacitor 33. In the following description, one of the metal pipes 31 is also referred to as "first metal pipe 31A", and the other of the metal pipes is referred to as "second metal pipe 31B". Moreover, the antenna 3 may also be a configuration having three or more metal pipes 31, and in this case, the number of the insulation pipe 32 and the number of the capacitor 33 are both one less than the number of the metal pipes 31.

Moreover, the cooling liquid CL circulates in the antenna 3 by a circulation flow path 14 arranged outside the vacuum container 2, and a temperature adjusting mechanism 141 such as a heat exchanger for adjusting the cooling liquid CL to a fixed temperature and a circulation mechanism 142 such as a pump for circulating the cooling liquid CL in the circulation flow path 14 are arranged in the circulation flow path 14. From the perspective of electrical insulation, the cooling liquid CL is preferably water with high resistance, for example, pure water or water close to pure water. Besides, for example, a liquid refrigerant other than water, such as fluorinated inert liquid and the like, may be used.

The metal pipe 31 is a straight tubular pipe inside which a linear flow path 31$x$ for the cooling liquid CL to flow is formed. Besides, a male screw portion 31$a$ is formed on at least an outer periphery portion of one end portion in a longitudinal direction of the metal pipe 31. In the metal pipe 31 of this embodiment, the end portion on which the male screw portion 31$a$ is formed and other members are formed by different components and are joined; however, the end portion and other members may also be formed from a single member. Moreover, in order to realize sharing of components with the configuration connecting a plurality of metal pipes 31, desirably, the male screw portions 31$a$ are formed on two end portions in the longitudinal direction of the metal pipes 31 to obtain compatibility. The material of the metal pipes 31 is, for example, copper, aluminum, alloys of copper and aluminum, stainless steel or the like.

The insulation pipe 32 is a straight tubular inside which a linear flow path 32$x$ for the cooling liquid CL to flow is formed. Besides, female portions 32$a$ screwed and connected to the male screw portions 31$a$ of the metal pipes 31 are formed on side peripheral walls on two end portions in an axial direction of the insulation pipe 32. In addition, on the side peripheral walls on two end portions in the axial direction of the insulation pipe 32, concave portions 32$b$ for fitting each of the electrodes 33A, 33B of the capacitor 33 are formed across the entire circumferential direction and nearer to the central side in the axial direction than the female portion 32$a$. The insulation pipe 32 of this embodiment is formed by a single member, but the insulation pipe 32 is not limited hereto. Moreover, the material of the insulation pipe 32 is, for example, alumina, fluorine resin, polyethylene (PE), engineering plastic (for example, polyphene sulfide (PPS), polyether ether ketone (PEEK) and so on) or the like.

The capacitor 33 is arranged inside the insulation pipe 32, specifically, the capacitor 33 is arranged in the flow path 32$x$ of the insulation pipe 32 where the cooling liquid CL flows.

Specifically, the capacitor 33 includes a first electrode 33A electrically connected to one of the mutually adjacent metal pipes 31 (the first metal pipe 31A), and a second electrode 33B electrically connected to the other of the mutually adjacent metal pipes 31 (the second metal pipe 31B) and disposed opposing the first electrode 33A, and the cooling liquid CL fills the space between the first electrode 33A and the second electrode 33B. That is, the cooling liquid CL flows in the space between the first electrode 33A and the second electrode 33B becomes the dielectric body constituting the capacitor 33.

Each of the electrodes 33A, 33B is substantially formed into a rotor shape and a main flow path 33 $x$ is formed on the central portion along a central axis of the electrode 33A, 33B. Specifically, each of the electrodes 33A, 33B has a flange portion 331 that comes into electrical contact with one end portion of the metal pipe 31 on the insulation pipe 32 side, and an extending portion 332 that extends from the flange portion 331 to the insulation pipe 32 side. In each of the electrodes 33A, 33B of this embodiment, the flange portion 331 and the extending portion 332 may be formed from a single member, or may be formed by different members and be joined. The material of the electrodes 33A, 33B is, for example, aluminum, copper, alloys of aluminum and copper, or the like.

The flange portion 331 comes into contact with the end portion of the metal pipe 31 on the insulation pipe 32 side across the entire circumferential direction. Specifically, an axial end surface of the flange portion 331 comes into contact, across the entire circumferential direction, with a leading end surface of a cylindrical contacting portion 311 formed on the end portion of the metal pipe 31, and comes into electrical contact with an end surface of the metal pipes 31 via a ring-shape multi-face contactor 15 arranged on the outer periphery of the contacting portion 311 of the metal pipe 31. Moreover, the flange portion 331 may come into electrical contact with the metal pipe 31 by any one of the contacting portion 311 and the multi-face contactor 15.

In addition, a plurality of through holes 331$h$ is formed on the flange portion 331 in a thickness direction. By arranging the through holes 331$h$ on the flange portion 331, flow path resistance of the cooling liquid CL caused by the flange portion 331 can be reduced, and retention of the cooling liquid CL in the insulation pipe 32 and collection of bubbles inside the insulation pipe 32 can be prevented.

The extending portion 332 is formed into a cylindrical shape, and the main flow path 33$x$ is formed inside. The extending portion 332 of the first electrode 33A and the extending portion 332 of the second electrode 33B are arranged coaxially with each other. That is, the extending portion 332 of the second electrode 33B is inserted into the extending portion 332 of the first electrode 33A. Accordingly, a cylindrical space along a flow path direction is formed between the extending portion 332 of the first electrode 33A and the extending portion 332 of the second electrode 33B.

Each of the electrodes 33A, 33B configured in this manner is fitted into the concave portion 32$b$ formed on the side peripheral wall of the insulation pipe 32. Specifically, the first electrode 33A is fitted into the concave portion 32$b$ formed on one end side of the insulation pipe 32 in the axial direction, and the second electrode 33B is fitted into the concave portion 32$b$ formed on the other end side of the insulation pipe 32 in the axial direction. By fitting each of the electrodes 33A, 33B into the concave portion 32$b$ in this manner, the extending portion 332 of the first electrode 33A and the extending portion 332 of the second electrode 33B are disposed coaxially with each other. In addition, the end surface of the flange portion 331 of each of the electrodes 33A, 33B comes into contact with a surface of each concave portion 32b facing outward in the axial direction, and thereby the insertion dimension of the extending portion 332 of the second electrode 33B with respect to the extending portion 332 of the first electrode 33A is defined.

In addition, by fitting each of the electrodes 33A, 33B into each concave portion 32b of the insulation pipe 32, and screwing the male screw portion 31a of the metal pipe 31 to the female portion 32a of the insulation pipe 32, the leading end surface of the contacting portion 311 of the metal pipe 31 comes into contact with the flange portion 331 of the electrodes 33A, 33B and each of the electrodes 33A, 33B is clamped and fixed between the insulation pipe 32 and the metal pipe 31. In this way, the antenna 3 of this embodiment becomes a structure in which the metal pipes 31, the insulation pipe 32, the first electrode 33A and the second electrode 33B are disposed coaxially. Moreover, the connection portion between the metal pipes 31 and the insulation pipe 32 has a seal structure for vacuum and the cooling liquid CL. The seal structure of the embodiment is achieved by a seal member 16 such as a packing disposed on a base end portion of the male screw portion 31a. Moreover, a tapered screw structure for pipe can also be used.
In this way, the seal structure between the metal pipe 31 and the insulation pipe 32, and the electrical connection between the metal pipe 31 and each of the electrodes 33A, 33B are realized along with the fastening of the male screw portion 31a and the female portion 32a, and thus the assembling operation becomes very easy.

In this configuration, when the cooling liquid CL flows from the first metal pipe 31A, the cooling liquid CL flows to the second electrode 33B side through the main flow path 33x and the through holes 331h of the first electrode 33A. The cooling liquid CL flowing to the second electrode 33B side flows to the second metal pipe 31B through the main flow path 33x and the through holes 331h of the second electrode 33B. At this time, the cylindrical space between the extending portion 332 of the first electrode 33A and the extending portion 332 of the second electrode 33B is filled with the cooling liquid CL, and the cooling liquid CL becomes a dielectric body and the capacitor 33 is formed.

Effect of the First Embodiment

According to the plasma treatment device 100 of the first embodiment configured in this manner, the capacitor 33 is connected electrically to and in series with the metal pipes 31 being mutually adjacent via the insulation pipe 32, and thus the synthetic reactance of the antenna 3, in short, becomes the form of subtracting the capacitive reactance from the inductive reactance, and thus the impedance of the antenna 3 can be reduced. As a result, even when the antenna 3 is lengthened, an increase in the impedance can be suppressed, the high-frequency current flows easily through the antenna 3, and the inductively coupled plasma P can be efficiently generated.

In particular, according to this embodiment, the space between the first electrode 33A and the second electrode 33B is filled with a liquid dielectric body (the cooling liquid CL), and thus the gaps generated between the electrodes 33A, 33B constituting the capacitor 33 and the dielectric body can be eliminated. As a result, the arc discharge to be generated in the gaps between the electrodes 33A, 33B and the dielectric body can be eliminated, and damage of the capacitor 33 caused by arc discharge can be eliminated. In addition, the capacitance value can be set with high precision from the separation distance and opposing area of the extending portion 332 of the first electrode 33A and the extending portion 332 of the second electrode 33B, and the relative permittivity of the liquid dielectric body (the cooling liquid CL), without considering the gaps. Furthermore, the structure that presses the electrodes 33A, 33B and the dielectric body to fill the gaps can also be omitted, and complication of the structure around the antenna caused by the pressing structure and deterioration in the uniformity of the plasma P generated accordingly can be prevented.

Because the cooling liquid CL that cools the antenna 3 is used as the dielectric body, it is unnecessary to prepare a dielectric body independently from the cooling liquid CL, and the electrodes 33A, 33B can be cooled. In addition, usually, the cooling liquid CL is adjusted to a fixed temperature by the temperature adjusting mechanism 141, and by using the cooling liquid CL as the dielectric body, the change in relative permittivity caused by temperature change can be suppressed, and the change in capacitance value can be suppressed. Furthermore, when water is used as the cooling liquid CL, because the relative permittivity of water is about 80 (20° C.) and is greater than the relative permittivity of the dielectric sheet made of resin, the capacitor 33 that can withstand a high voltage can be configured. Here, due to the large relative permittivity, even if the capacitor 33 is a two-tube structure consisting of two extending portions 332, sufficient capacitance value can be obtained. Therefore, each of the electrodes 33A, 33B can be manufactured while the perpendicularity of the extending portion 332 with respect to the flange portion 331 of each of the electrodes 33A, 33B has high precision, and the capacitance value can be set with high precision. Besides, although impurities may be mixed due to electrolysis of water, the impurities can be removed by arranging a filter such as an ion exchange membrane filter on the circulation flow path 14, and the change in the capacitance value of the capacitor 33 can be suppressed.

Variation Example of the First Embodiment

Figure 3:
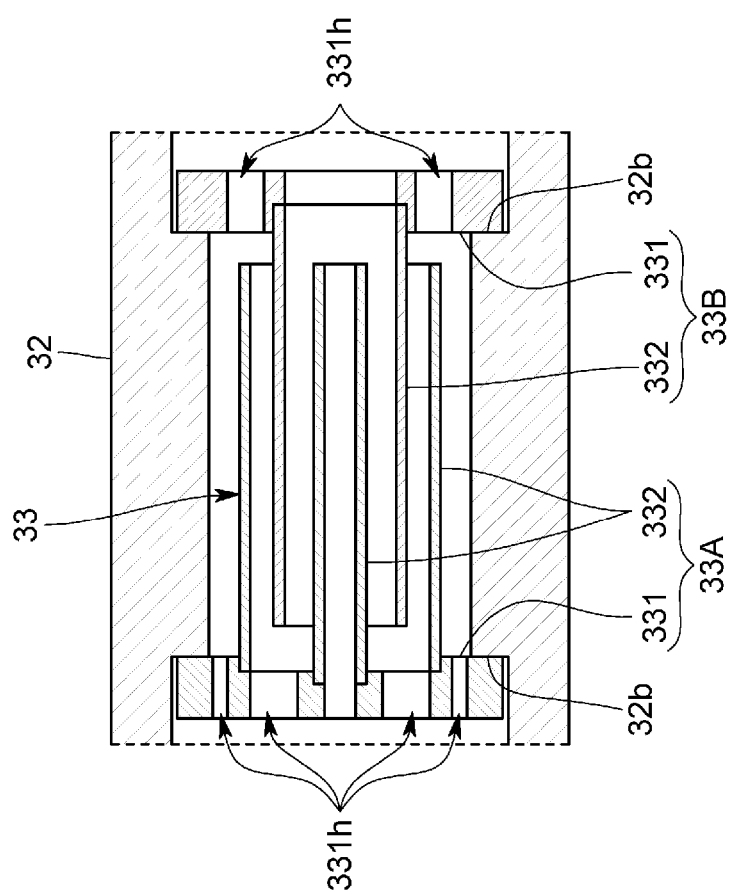
FIG. 3 is an enlarged sectional view which schematically shows the capacitance element of a variation embodiment.

For example, in the embodiment above, the capacitor 33 is a two-tube structure consisting of two cylindrical extending portions; however, as shown in FIG. 3, there may also be three or more cylindrical extending portions 332 disposed coaxially. In this case, the extending portion 332 of the first electrode 33A and the extending portion 332 of the second electrode 33B are alternately disposed. In FIG. 3, among the three extending portion 332s, the two on the inner side and the outer side are the extending portions 332 of the first electrode 33A, and the one in the middle is the extending portion 332 of the second electrode 33B. According to this configuration, the opposing area can be increased without increasing the axial dimension of the capacitor 33.

Figure 4:
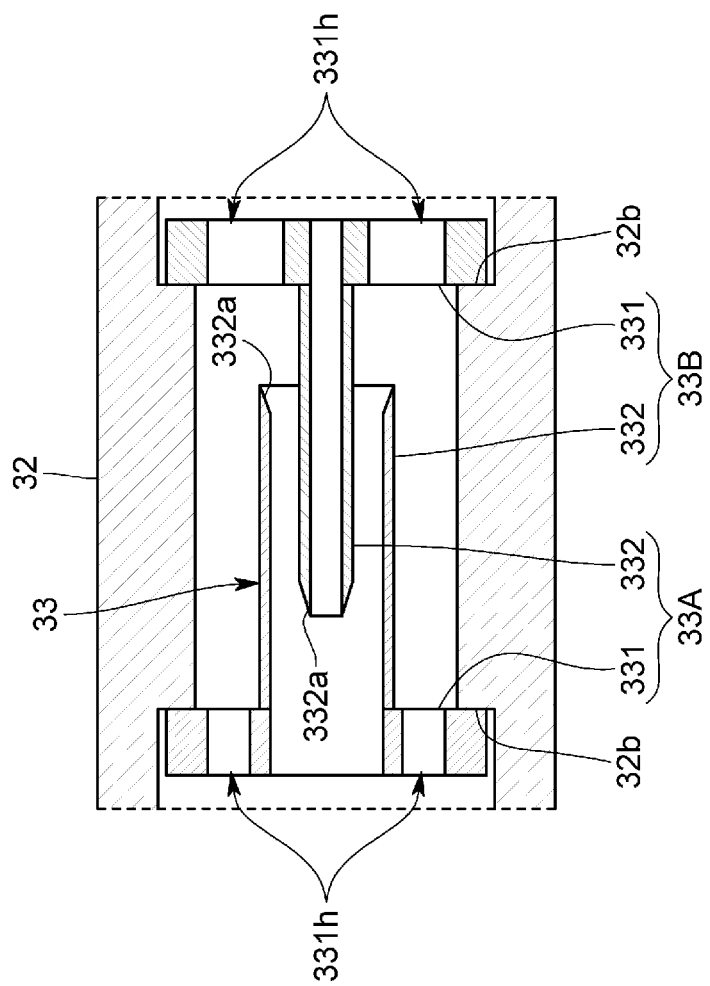
FIG. 4 is an enlarged sectional view which schematically shows the capacitance element of a variation embodiment.

In addition, in order to relieve electric field concentration in leading corners of the extending portions 332 which become the opposing electrodes of the capacitor 33, as shown in FIG. 4, a part of the leading corners 332a of the extending portions 332 may be cut into a tapered shape. Specifically, the inner circumferential surface of the leading corner 332a of the extending portion 332 of the first electrode 33A is cut into a tapered shape, and the outer circumferential surface of the leading corner 332a of the extending portion 332 of the second electrode 33B is cut into a tapered shape.

Figure 5:
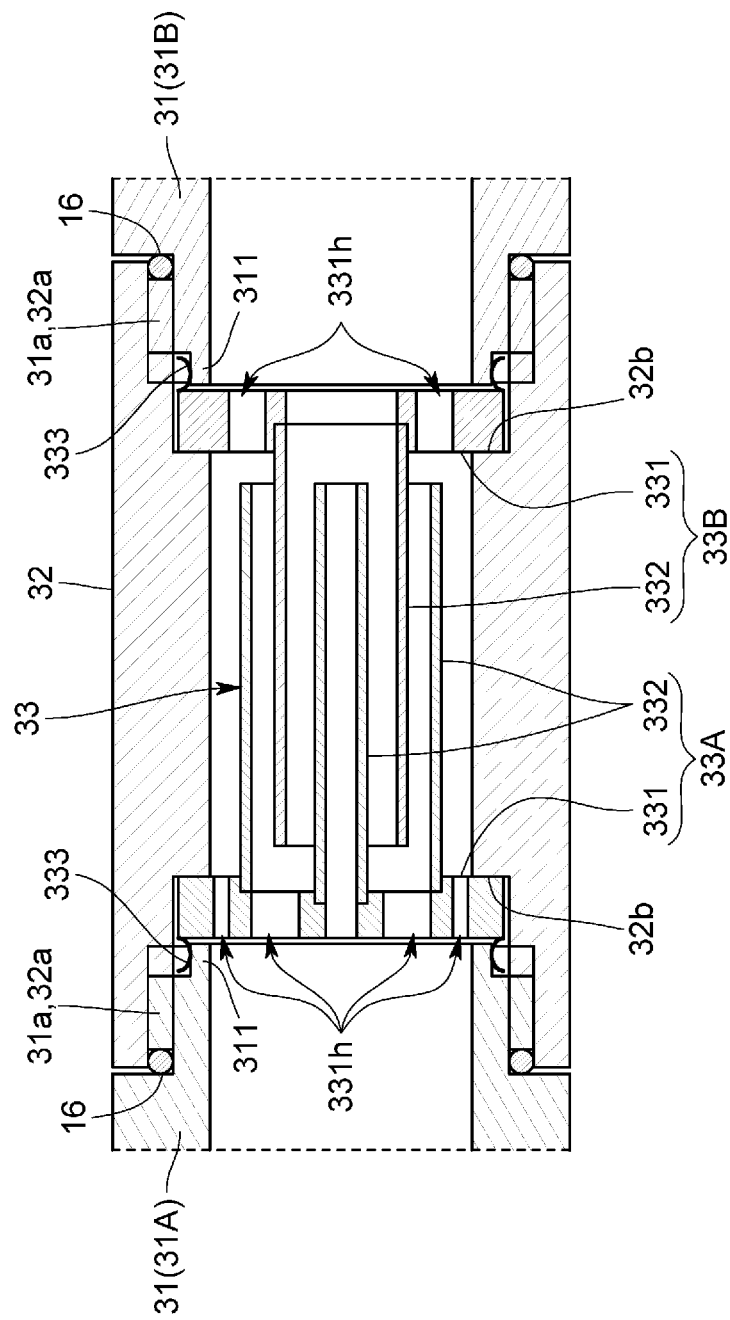
FIG. 5 is an enlarged sectional view which schematically shows the surrounding structure of the capacitance element in the antenna of a variation embodiment.

Furthermore, as for the contact between the electrodes 33A, 33B and the metal pipes 31, in addition to the contact between the end surfaces, as shown in FIG. 5, contact terminals 333 may be arranged on the electrodes 33A, 33B and come into contact with the metal pipes 31. In the configuration of FIG. 5, the contact terminals 333 that protrude axially outward from the flange portions 331 of the electrodes 33A, 33B are arranged, and the contact terminals 333 are pressed to and come into contact with the outer circumferential surfaces of the contacting portions 311 of the metal pipes 31. In this configuration, the relative position of each of the electrodes 33A, 33B is defined by the surface facing axially of the concave portion 32b of the insulation pipe 32.

In the embodiment, the capacitor is accommodated inside the insulation pipe, but the capacitor may also be arranged outside the insulation pipe. For example, the first electrode and the second electrode constituting the capacitor are arranged on the outer periphery portion of the insulation pipe, and a liquid dielectric body is filled between the electrodes. In addition, the first electrode and the second electrode may be electrically connected to the metal pipes and be separated from the insulation pipes. In these configurations, the liquid dielectric body may be the cooling liquid supplied by a branch flow path that branches from the internal flow path of the antenna, or be liquid dielectric body supplied by a path different from the cooling liquid. In addition, the liquid dielectric body may be sealed between the first electrode and the second electrode. Moreover, when the liquid dielectric body is sealed, arrangement of a temperature adjusting mechanism for adjusting the temperature of the liquid dielectric body to a fixed temperature is required.

2. Second Embodiment

Next, a second embodiment of the present invention is described. Moreover, the members identical to or corresponding to the first embodiment are denoted by identical symbols.

In the plasma treatment device 100 of the second embodiment, the configuration of the antenna 3, especially the configuration of the capacitor 33 is different from the first embodiment.

Figure 6:
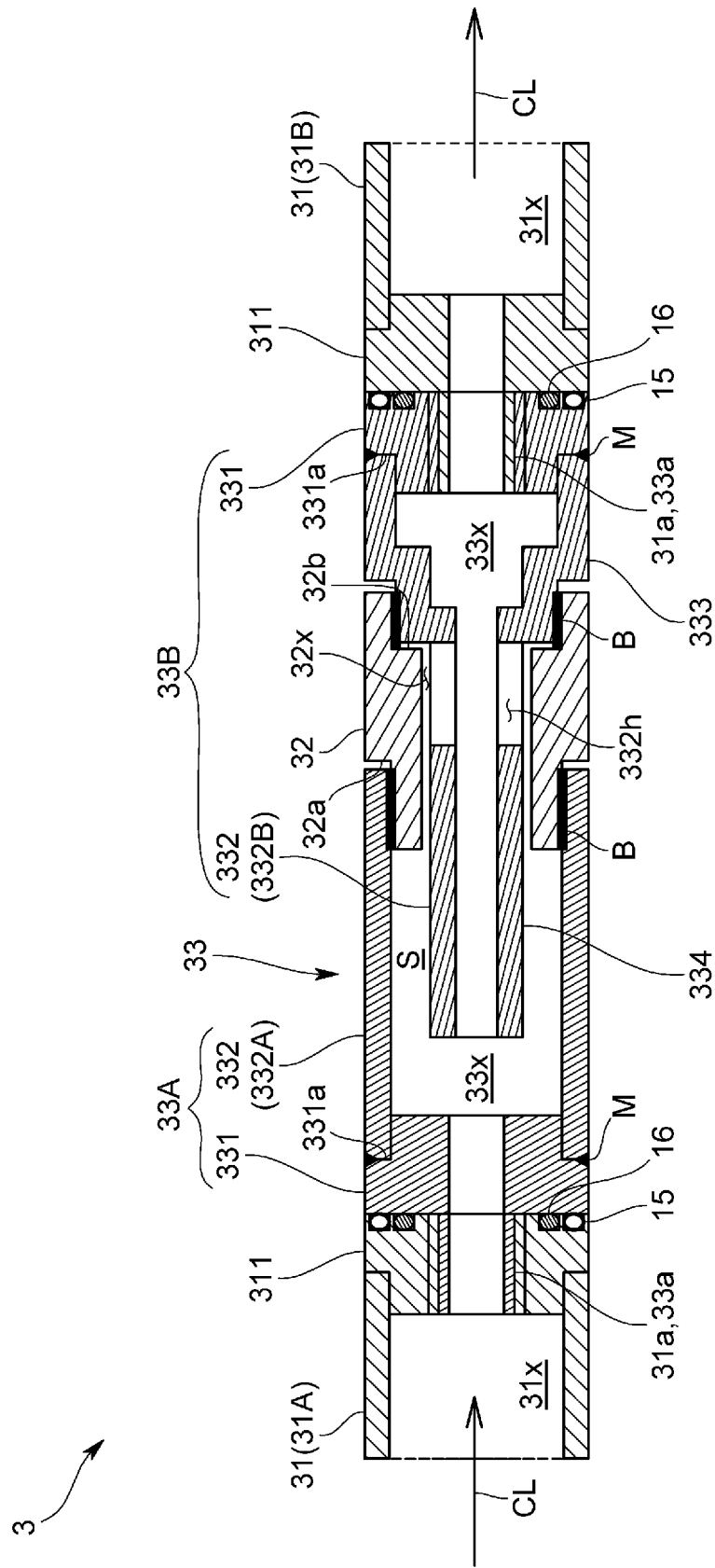
FIG. 6 is an enlarged sectional view which schematically shows a surrounding structure of a capacitance element in an antenna of a second embodiment.

The antenna 3 is a hollow structure inside which there is a flow path for the cooling liquid CL to circulate. Specifically, as shown in FIG. 6, the antenna 3 includes at least two tubular conductor elements 31 made of metal (referred to as "metal pipes 31" hereinafter), a tubular insulation element 32 (referred to as "insulation pipe 32" hereinafter) which is disposed between the mutually adjacent metal pipes 31 and insulates the metal pipes 31, and a capacitor 33 which is a capacitance element connected electrically to and in series with the mutually adjacent metal pipes 31.

In this embodiment, there are two metal pipes 31, and respectively one insulation pipe 32 and one capacitor 33. In the following description, one of the metal pipes 31 is also called "the first metal pipe 31A", and the other of the metal pipes 31 is also called "the second metal pipe 31B". Here, the first metal pipe 31A is the metal pipe 31 that is disposed on the upstream side in the flow direction of the cooling liquid CL, and the second metal pipe 31B is the metal pipe 31 that is disposed on the downstream side in the flow direction of the cooling liquid CL. In addition, here, the first metal pipe 31A and the second metal pipe 31B have mutually equivalent external diameter and internal diameter and are disposed coaxially. However, the external diameters and the internal diameter of the metal pipes 31 may be appropriately changed, and the metal pipes 31 are not required to be disposed axially. Furthermore, the antenna 3 may be a configuration having three or more metal pipes 31; in this case, the number of the insulation pipe 32 and the number of the capacitor 33 are both one less than the number of the metal pipes 31.

The metal pipe 31 is a straight tubular pipe inside which the linear flow path 31x for the cooling liquid CL to flow is formed. The material of the metal pipe 31 is, for example, copper, aluminum, alloys of copper and aluminum, stainless steel or the like.

The insulation pipe 32 is a straight tubular pipe inside which the linear flow path 32x for the cooling liquid CL to flow is formed. The insulation pipe 32 of this embodiment has the same external diameter as the external diameter of the metal pipes 31 and is disposed coaxially with the metal pipes 31. In addition, the insulation pipe 32 is formed from a single member, and the material is, for example, alumina, fluorine resin, polyethylene (PE), engineering plastic (for example, polyphene sulfide (PPS), polyether ether ketone (PEEK) and so on) and the like. Moreover, the dimension, disposal, member and the like of the insulation pipe 32 are not limited hereto.

The capacitor 33 is interposed between the first metal pipe 31A and the second metal pipe 31B, and the main flow path 33x for communicating the flow path 31x of the first metal pipe 31A and the flow path 31x of the second metal pipe 31B is formed inside the capacitor 33.

Specifically, the capacitor 33 includes a first electrode 33A that is electrically connected to the first metal pipe 31A and disposed nearer to the first metal pipe 31A side than the insulation pipe 32, and a second electrode 33B electrically connected to the second metal pipe 31B, which extends from the second metal pipe 31B side to the first metal pipe 31A side through the inside of the insulation pipe 32 and is disposed opposing the first electrode 33A; and a space S between the first electrode 33A and the second electrode 33B is filled with the cooling liquid CL. That is, the cooling liquid CL flowing in the space S between the first electrode 33A and the second electrode 33B becomes the dielectric body constituting the capacitor 33.

Here, the first electrode 33A and the first metal pipe 31A are joined to each other by screwing a male screw portion formed on the axial end portion of one of the first electrode 33A and the first metal pipe 31A and a female portion formed on the axial end portion of the other of the first electrode 33A and the first metal pipe 31A. In this embodiment, the male screw portion 31a is formed on the inner periphery portion of the axial end portion of the first metal pipe 31A, and a female portion 33a is formed on the outer periphery portion of the axial end portion of the first electrode 33A, and the first metal pipe 31A and the first electrode 33A are joined by screwing in a state that the axial end portion of the first electrode 33A is inserted into the first metal pipe 31A.

In addition, the second electrode 33B and the second metal pipe 31B are joined to each other by screwing a male screw portion formed on the axial end portion of one of the second electrode 33B and the second metal pipe 31B and a female portion formed on the axial end portion of the other of the second electrode 33B and the second metal pipe 31B. In this embodiment, the male screw portion 31a is formed on the outer periphery portion of the axial end portion of the second metal pipe 31B, and a female portion 33a is formed on the inner periphery portion of the axial end portion of the second electrode 33B, and the second metal pipe 31B and the second electrode 33B are joined by screwing in a state that the axial end portion of the second metal pipe 31B is inserted into the second electrode 33B.

In the following, each of the electrodes 33A, 33B is described in detail.

Each of the electrodes 33A, 33B is substantially formed into a rotor shape, and the main flow path 33x is formed on the central portion along a central axis of the electrode 33A, 33B. Here, each of the electrodes 33A, 33B is formed into a tubular shape and arranged not protruding further to the outside than the metal pipes 31 when viewed from the axial direction. The material of each of the electrodes 33A, 33B is, for example, aluminum, copper, alloys of aluminum and copper, or the like.

Specifically, each of the electrodes 33A, 33B has a contacting portion 331 that comes into contact with and is electrically connected to the end portion of the metal pipes 31 on the insulation pipe 32 side by being screwed together with the metal pipes 31, and an extending portion 332 that extends from the contacting portion 331 to the insulation pipe 32 side. The contacting portion 331 and the extending portion 332 may be formed from a single member, or be formed by different members and be joined.

The contacting portion 331 comes into contact with the end portion of the metal pipes 31 on the insulation pipe 32 side across the entire circumferential direction. Specifically, the contacting portion 331 is formed into a cylindrical shape, and the axial end surface of the contacting portion 331 comes into contact with a leading end surface of a cylindrical contacted portion 311 formed on the end portion of the metal pipe 31 across the entire circumferential direction. Moreover, the external diameter of the contacting portion 331 is equal to or less than the external diameter of the metal pipe 31; here, the external diameter of the contacting portion 331 is equal to the external diameter of the metal pipe 31. Furthermore, the contacting portion 331 comes into electrical contact with the end surface of the metal pipe 31 via a ring-shape multi-face contactor 15 arranged between the contacting portion 331 and the contacted portion 311. However, it is unnecessary to arrange both the contacted portion 311 and the ring-shape multi-face contactor 15, and the contacting portion 331 and the metal pipe 31 may be brought into electrical contact by any one of the contacted portion 311 and the ring-shape multi-face contactor 15.

In addition, a seal structure to vacuum and the cooling liquid CL is interposed between the contacting portion 331 and the contacted portion 311. The seal structure of this embodiment is achieved by a seal member 16 such as an O-ring arranged between the contacting portion 331 and the contacted portion 311.

The extending portion 332 is formed into a cylindrical shape, and the main flow path 33x is formed inside. An extending portion 332 of the first electrode 33A (referred to as "first extending portion 332A" hereinafter) and an extending portion 332 of the second electrode 33B (referred to as "second extending portion 332B" hereinafter) are disposed coaxially with each other, and as shown in FIG. 6, a double tubular structure is configured in which the first extending portion 332A is disposed on the outer side and the second extending portion 332B is disposed on the inner side.

The first extending portion 332A is interposed between the contacting portion 331 of the first electrode 33A and the insulation pipe 32, the base end portion of the first extending portion 332A is joined with the contacting portion 331, and the leading end portion is fixed to the insulation pipe 32. More specifically, the axial end portion of the contacting portion 331 on the insulation pipe 32 side is configured in a manner that a cut-out portion 331a formed by cutting the outer periphery portion in the circumferential direction is formed and has an external diameter smaller than other parts, and the base end portion of the first extending portion 332A is fitted into the cut-out portion 331a. In addition, the axial end portion of the insulation pipe 32 on the first metal pipe 31A side is configure in a manner that an outer periphery cut-out portion 32a formed by cutting the outer periphery portion in the circumferential direction is formed and has an external diameter smaller than other parts, and the leading end portion of the first extending portion 332A is fitted into the outer periphery cut-out portion 32a.

That is, the internal diameter of the first extending portion 332A is equal to or slightly greater than the external diameter of the axial end portion of the contacting portion 331 on the insulation pipe 32 side, and is equal to or slightly greater than the external diameter of the axial end portion of the insulation pipe 32 on the first metal pipe 31A side. On the other hand, the external diameter of the first extending portion 332A is designed to be equal to or less than the external diameter of the metal pipes 31; here, the external diameter of the first extending portion 332A is equal to the external diameter of the metal pipes 31.

Moreover, the base end portion of the first extending portion 332A and the contacting portion 331 are joined by, for example, a weld M or the like, and the leading end portion of the first extending portion 332A and the insulation pipe 32 are fixed by, for example, a braze B or the like, but the joining method or fixing method is not limited hereto.

As described above, the second extending portion 332B extends from the second metal pipe 31B side to the first metal pipe 31A side through the inside of the insulation pipe 32, and configures a double tubular structure along with the first extending portion 332A.

Therefore, the second extending portion 332B has a diameter-reduced element 333 which is interposed between the contacting portion 331 of the second electrode 33B and the insulation pipe 32 and in which the external diameter of the leading end portion is smaller than the external diameter of the base end portion, and a straight-pipe element 334 which extends from the leading end portion of the diameter-reduced element 333 to the first metal pipe 31A side through the inside of the insulation pipe 32. Moreover, the diameter-reduced element 333 and the straight-pipe element 334 may be formed from a single member, or formed by different components and are joined by welding or the like.

The diameter-reduced element 333 is configured in a manner that at least the external diameter decreases step by step or gradually from the base end portion toward the leading end portion; here, the diameter-reduced element 333 is a shape in which the external diameter and the internal diameter decreases step by step. In the diameter-reduced element 333, the base end portion is joined to the contacting portion 331, and the leading end portion is fixed to the insulation pipe 32. More specifically, as described above, the axial end portion of the contacting portion 331 on the insulation pipe 32 side is formed in a manner that the cut-out portion 331a formed by cutting the outer periphery portion in the circumferential direction is formed and has an external diameter smaller than other parts, and the base end portion of the diameter-reduced element 333 is fitted into the cut-out portion 331a. In addition, the axial end portion of the insulation pipe 32 on the second metal pipe 31B side is configured in a manner that an inner periphery cut-out portion 32b formed by cutting the inner periphery portion in the circumferential direction is formed and has an internal diameter smaller than other parts, and the leading end portion of the diameter-reduced element 333 is fitted into the inner periphery cut-out portion 32b.

That is, the internal diameter of the base end portion of the diameter-reduced element 333 is equal to or slightly greater than the external diameter of the axial end portion of the contacting portion 331 on the insulation pipe 32 side, and the external diameter of the leading end portion of the diameter-reduced element 333 is equal to or slightly greater than the internal diameter of the axial end portion of the insulation pipe 32 on the first metal pipe side. In addition, the external diameter of the base end portion of the diameter-reduced element 333 is designed to be equal to or less than the external diameter of the metal pipes 31; here, the external diameter of the base end portion of the diameter-reduced element 333 is equal to the external diameter of the metal pipes 31. Moreover, the base end portion of the diameter-reduced element 333 and the contacting portion 331 are joined by, for example, a weld M or the like, and the leading end portion of the diameter-reduced element 333 and the insulation pipe 32 are fixed by, for example, a braze B or the like, but the joining method or the fixing method is not limited hereto.

The straight-pipe element 334 is arranged in a state that the straight-pipe element 334 extends from the leading end portion of the diameter-reduced element 333 to the first metal pipe 31A side and is inserted into the first extending portion 332A through the inside of the insulation pipe 32. Accordingly, a cylindrical space S along the flow path direction is formed between the straight-pipe element 334 and the first extending portion 332A. Specifically, the straight-pipe element 334 has an external diameter smaller than the internal diameter of the insulation pipe 32 and the internal diameter of the first extending portion 332A, and is disposed coaxially with the first extending portion 332A. Accordingly, the distance between the internal circumferential surface of the first extending portion 332A and the external circumferential surface of the straight-pipe element 334 is fixed along the circumferential direction. Moreover, here, the internal diameter of the straight-pipe element 334 is set to a dimension the same as the internal diameter of the leading end portion of the diameter-reduced element 333, but the internal diameter is not limited hereto.

In addition, in the straight-pipe element 334, a plurality of through holes 332h which penetrates the circumferential wall of the straight-pipe element 334 in the thickness direction is formed. Specifically, the through holes 332h are formed along the flow direction of the cooling liquid CL so as to oppose at least a part of the internal circumferential surface of the insulation pipe 32, and makes the space between the straight-pipe element 334 and the insulation pipe 32 communicate with the main flow path 33x of the second electrode 33B. The through holes 332h are arranged at equal intervals in the circumferential direction and are arranged between the base end of the straight-pipe element 334 to the leading end of the first extending portion 332A along the axial direction. By arranging the through holes 332h, the flow path resistance of the cooling liquid CL caused by the second electrode 33B can be reduced, and retention of the cooling liquid CL inside the insulation pipe 32 and collection of bubbles inside the insulation pipe 32 can be prevented.

According to each of the electrodes 33A, 33B configured in this way, by screwing the male screw portion 31a of the metal pipes 31 with the female portion 33a of each of the electrodes 33A, 33B, the leading end surface of the contacted portion 311 of the metal pipe 31 comes into contact with the contacting portion 331 of each of the electrodes 33A, 33B, and the space there between is sealed by the seal member 16; moreover, each electrode 33A and 33B are disposed coaxially with each other, and the insertion dimension of the extending portion 332B of the second electrode 33B with respect to the extending portion 332A of the first electrode 33A is defined.

In this way, the seal between the metal pipes 31 and the insulation pipe 32, the electrical contact between the metal pipes 31 and each of the electrodes 33A, 33B, and the disposal of each of the electrodes 33A, 33B are performed along with the fastening of the male screw portion 31a and the female portion 33a, and thus the assembling operation becomes very easy.

In this configuration, when the cooling liquid CL flows from the first metal pipe 31A, a part of the cooling liquid CL flows from the main flow path 33x of the first electrode 33A to the main flow path 33x of the second electrode 33B to be introduced into the second metal pipe 31B, and the rest of the cooling liquid CL branches from the main flow path 33x and flows into the space S between the first extending portion 332A and the second extending portion 332B. The cooling liquid CL flowing into the space S flows through the through holes 332h to join the cooling liquid CL at the main flow path 33x of the second electrode 33B and be introduced into the second metal pipe 31B. At this time, the cylindrical space S between the extending portion 332A of the first electrode 33A and the extending portion 332B of the second electrode 33B is filled with the cooling liquid CL, the cooling liquid CL functions as the dielectric body, and the capacitor 33 is configured.

Effect of Second Embodiment

According to the plasma treatment device 100 of the second embodiment configured in this way, the capacitor 33 is connected electrically to and in series with the metal pipes 31 being mutually adjacent via the insulation pipe 32, and thus the synthetic reactance of the antenna 3, in short, becomes the form of subtracting the capacitive reactance from the inductive reactance, and thus the impedance of the antenna 3 can be reduced. As a result, even when the antenna 3 is lengthened, an increase in the impedance can be suppressed, the high-frequency current flows easily through the antenna 3, and the inductively coupled plasma P can be efficiently generated.

In particular, according to this embodiment, the space S between the first electrode 33A and the second electrode 33B is filled with a liquid dielectric body (the cooling liquid CL), and thus the gaps generated between the electrodes 33A, 33B constituting the capacitor 33 and the dielectric body can be eliminated. As a result, the arc discharge to be generated in the gaps between the electrodes 33A, 33B and the dielectric body can be eliminated, and damage of the capacitor 33 caused by arc discharge can be eliminated. In addition, the capacitance value can be set with high precision from the separation distance and opposing area of the extending portion 332A of the first electrode 33A and the extending portion 332B of the second electrode 33B, and the relative permittivity of the liquid dielectric body (the cooling liquid CL), without considering the gaps. Furthermore, the structure that presses the electrodes 33A, 33B and the dielectric body to fill the gaps can also be omitted, and complication of the structure around the antenna caused by the pressing structure and deterioration in the uniformity of the plasma P generated accordingly can be prevented. Additionally, because the second electrode 33B is made to oppose the first electrode 33A by extending the second electrode 33B from the second metal pipe 31B side to the first metal pipe 31A side through the inside of the insulation pipe 32, the capacitance value required for the capacitor 33 can be easily obtained by changing the extending dimension of the second electrode 33B.

Because the cooling liquid CL that cools the antenna 3 is used as the dielectric body, it is unnecessary to prepare a dielectric body independently from the cooling liquid CL, and the electrodes 33A, 33B can be cooled. In addition, usually, the cooling liquid CL is adjusted to a fixed temperature by the temperature adjusting mechanism 141, and by using the cooling liquid CL as the dielectric body, the change in relative permittivity caused by temperature change can be suppressed, and the change in capacitance value can be suppressed. Furthermore, when water is used as the cooling liquid CL, because the relative permittivity of water is about 80 (20° C.) and is greater than the relative permittivity of the dielectric sheet made of resin, the capacitor 33 that can withstand a high voltage can be configured. In this way, if the dielectric body has a large relative permittivity, even if the capacitor 33 is a double tubular structure consisting of two extending portion 332A, 332B, sufficient capacitance value can be obtained. Furthermore, by manufacturing each of the electrodes 33A, 33B while the perpendicularity of the extending portion 332 with respect to the contacting portion 331 of each of the electrodes 33A, 33B has high precision, the capacitance value can be set with high precision. Besides, although impurities may be mixed due to electrolysis of water, the impurities can be removed by arranging a filter such as an ion exchange membrane filter on the circulation flow path 14, and the change in the capacitance value of the capacitor 33 can be suppressed.

Furthermore, because the distance between the internal circumferential surface of the first extending portion 332A and the external circumferential surface of the second extending portion 332B (more specifically, the external circumferential surface of the straight-pipe element 334) is fixed along the circumferential direction, the distribution of the high-frequency current flowing through the metal pipes 31 can be homogenized in the circumferential direction to generate plasma with high uniformity.

Variation Example of the Second Embodiment

Figure 7:
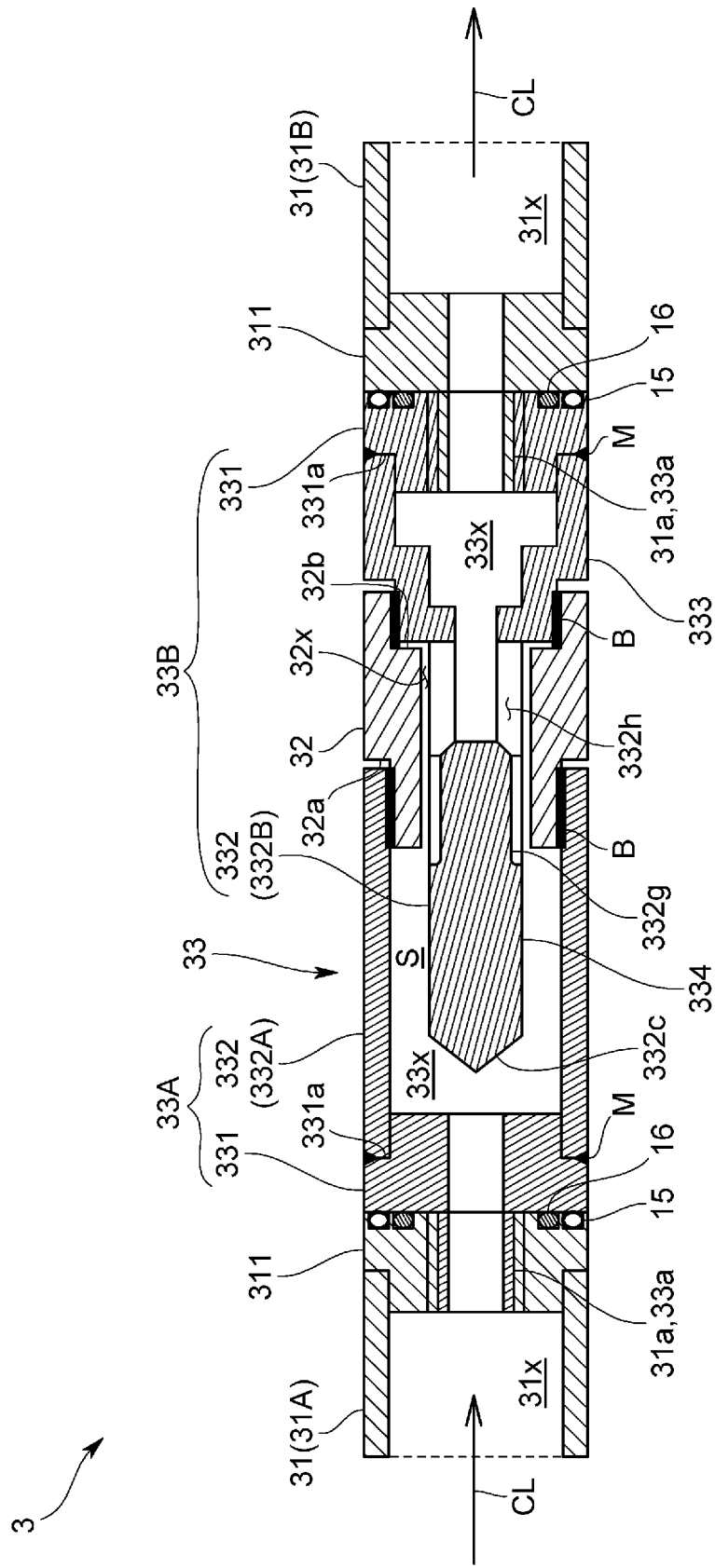
FIG. 7 is an enlarged sectional view which schematically shows the capacitance element of a variation embodiment.

For example, in the second embodiment, the second electrode 33B is tubular, and the main flow path 33x is formed from the first metal pipe 31A side across the entire second metal pipe 31B side; however, as shown in FIG. 7, in the second electrode 33B, the main flow path 33x may be formed on the second metal pipe 31B side and the first metal pipe 31A side may be solid.

In this case, in order to reduce the flow path resistance of the cooling liquid CL caused by the second electrode 33B, preferably, in the second electrode 33B, one or a plurality of groove(s) 332g which communicates with the through holes 332h and extends along the flow direction of the cooling liquid CL is formed. Specifically, the grooves 332g are bottomed grooves arranged for each of the through holes 332h and extending in the axial direction, and the opening of the groove 332g is formed opposing the internal circumferential surface of the insulation pipe 32.

In addition, in order to relieve electric field concentration in a leading corner 332c of the second electrode 33B, as shown in FIG. 7, the leading corner 332c of the second extending portion 332B may be a tapered shape (conical shape).

Furthermore, as described above, in a case that a part of the second electrode 33B is solid, compared with the case that the second electrode 33B is tubular, the flow path resistance of the cooling liquid CL increases. As an embodiment to reduce the flow path resistance, thinning of the second electrode 33B is considered; however, in this case, the distance between the internal circumferential surface of the first electrode 33A and the external circumferential surface of the second electrode 33B is lengthened, the capacitance value of the capacitor 33 decreases, and there is a risk of being unable to withstand high voltage.

Figure 8:
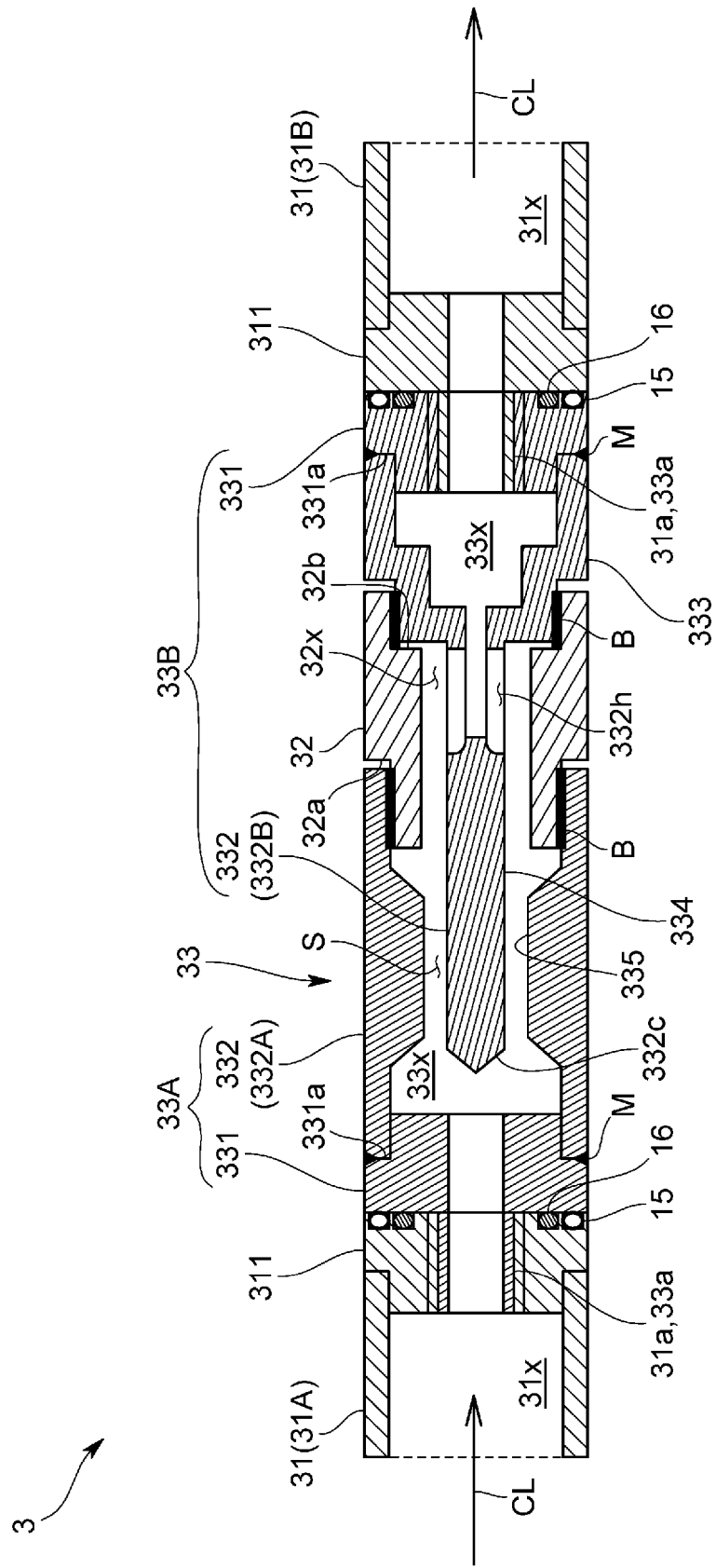
FIG. 8 is an enlarged sectional view which schematically shows the capacitance element of a variation embodiment.

Therefore, in order to reduce the flow path resistance of the cooling liquid CL caused by the second electrode 33B and guarantee the capacitance value required for the capacitor 33, as shown in FIG. 8, preferably, the first electrode 33A has a restricted portion 335 which is located opposing the second electrode 33B and in which the internal diameter decreases.

According to this configuration, the second electrode 33B is thinned to reduce the flow path resistance of the cooling liquid CL and the restricted portion 335 is formed on the first electrode 33A, and thus the distance between the external circumferential surface of the first electrode 33A and the internal circumferential surface of the second electrode 33B can be shortened by the restricted portion 335, and the capacitance value required for the capacitor 33 can be guaranteed.

Figure 9:
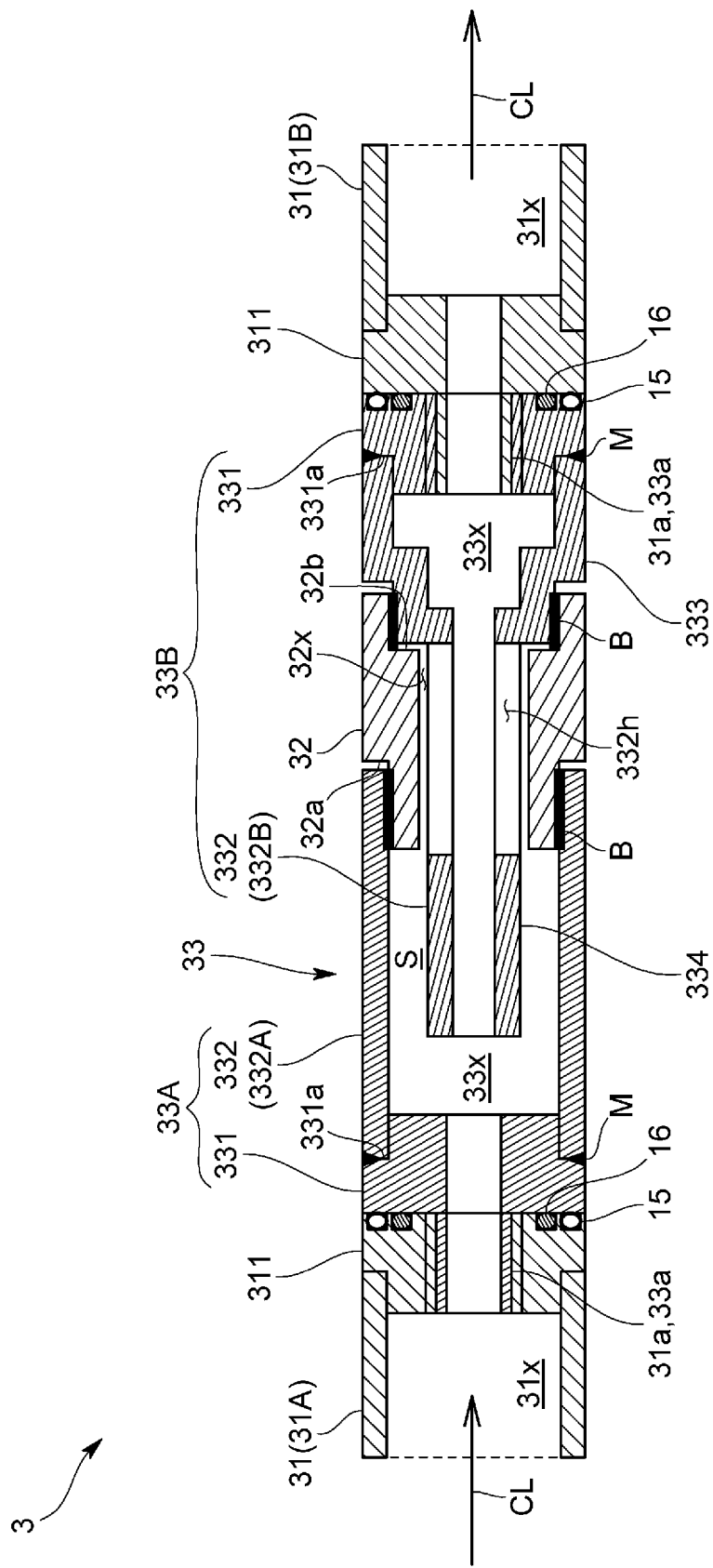
FIG. 9 is an enlarged sectional view which schematically shows the capacitance element of a variation embodiment.

In addition, e second embodiment, through holes 332h are arranged from the base end of the straight-pipe element 334 to the leading end of the first extending portion 332A along the axial direction; however, as shown in FIG. 9, the through holes 332h may also be arranged beyond the leading end of the first extending portion 332A in the axial direction, or the through holes 332h may stay in front of the straight-pipe element 334 without extending to the base end, although the situation is not shown.

Figure 10:
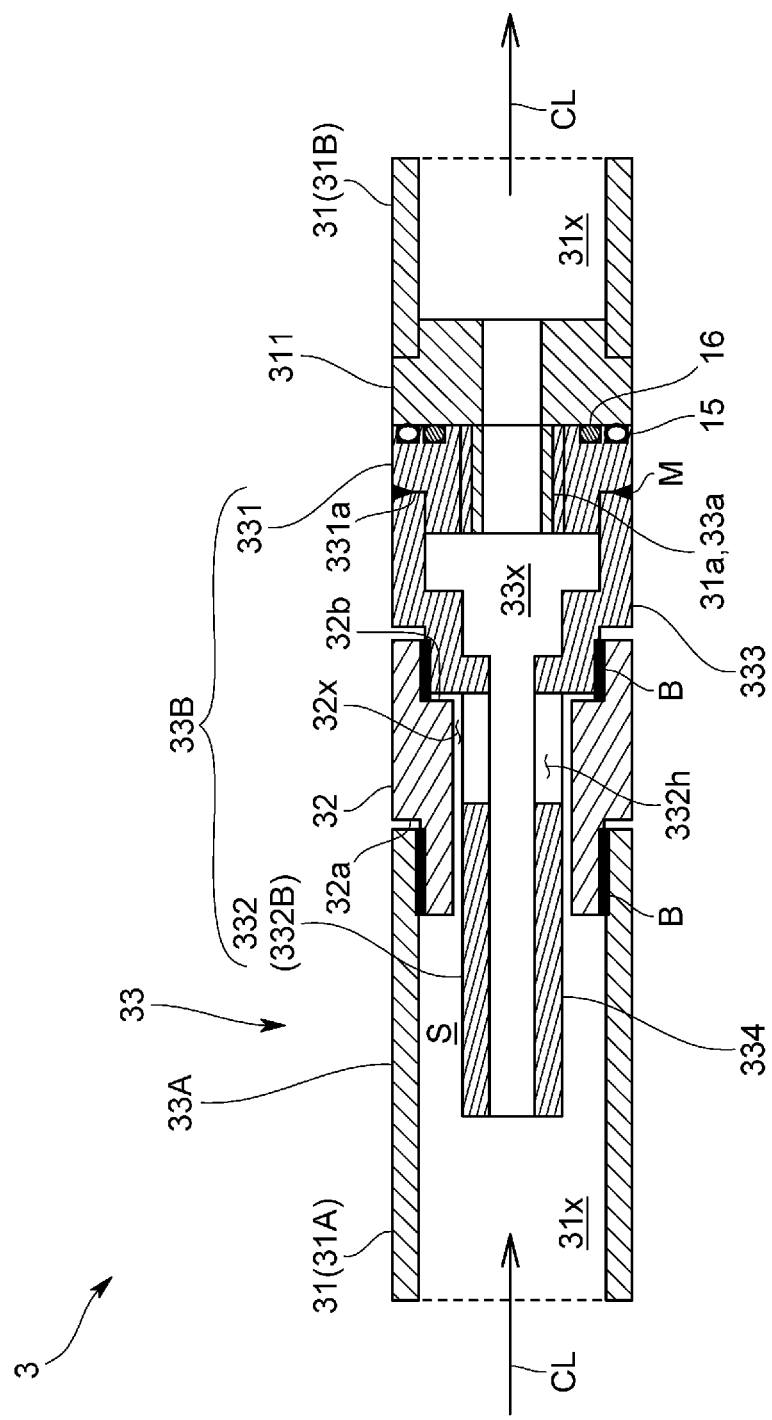
FIG. 10 is an enlarged sectional view which schematically shows the capacitance element of a variation embodiment.

Furthermore, in the second embodiment, the case in which the first electrode 33A and the metal pipe 31 are different members is described; however, as shown in FIG. 10, the first electrode 33A may consists of a part of the metal pipe 31.

As a specific embodiment, the following configuration is mentioned in which the axial end portion of the first metal pipe 31A is extended to the insulation pipe 32 side, and the second electrode 33B is extended from the second metal pipe 31B side into the first metal pipe 31A through the inside of the insulation pipe 32. In this case, the axial end portion of the first metal pipe 31A is fixed to the insulation pipe 32. The specific fixing method is similar to the method in the aforementioned embodiments, and the following method is mentioned in which an outer periphery cut-out portion 32a formed by cutting the outer periphery portion in the circumferential direction is formed on the axial end portion of the insulation pipe 32 on the first metal pipe 31A side, and the axial end portion of the first metal pipe 31A is fitted into the outer periphery cut-out portion 32a and fixed by, for example, a braze B and the like.

According to this configuration, the part of the first metal pipe 31A that opposes the second electrode can function as the first electrode 33A, and the operation effect similar to the aforementioned embodiments can be obtained while reducing the number of components.

Additionally, in the second embodiment, the metal pipe 31 disposed on the upstream side in the flow direction of the cooling liquid CL is set as the first metal pipe 31A, and the metal pipe 31 disposed on the downstream side in the flow direction of the cooling liquid CL is set as the second metal pipe 31B. Vice versa, the metal pipe 31 disposed on the downstream side in the flow direction of the cooling liquid CL may be set as the first metal pipe 31A, and the metal pipe 31 disposed on the upstream side in the flow direction of the cooling liquid CL may be set as the second metal pipe 31B. In other words, in the state that each member is disposed as shown in FIG. 6, the flow direction of the cooling liquid CL may be opposite to the flow direction in the aforementioned embodiments. However, considering the easiness to remove the air when the cooling liquid CL starts to flow, the flowing of the cooling liquid CL in the directions of the aforementioned embodiments is advantageous.

3. Other Variation Embodiments

Moreover, the present invention is not limited to the aforementioned embodiments.

Figure 11:
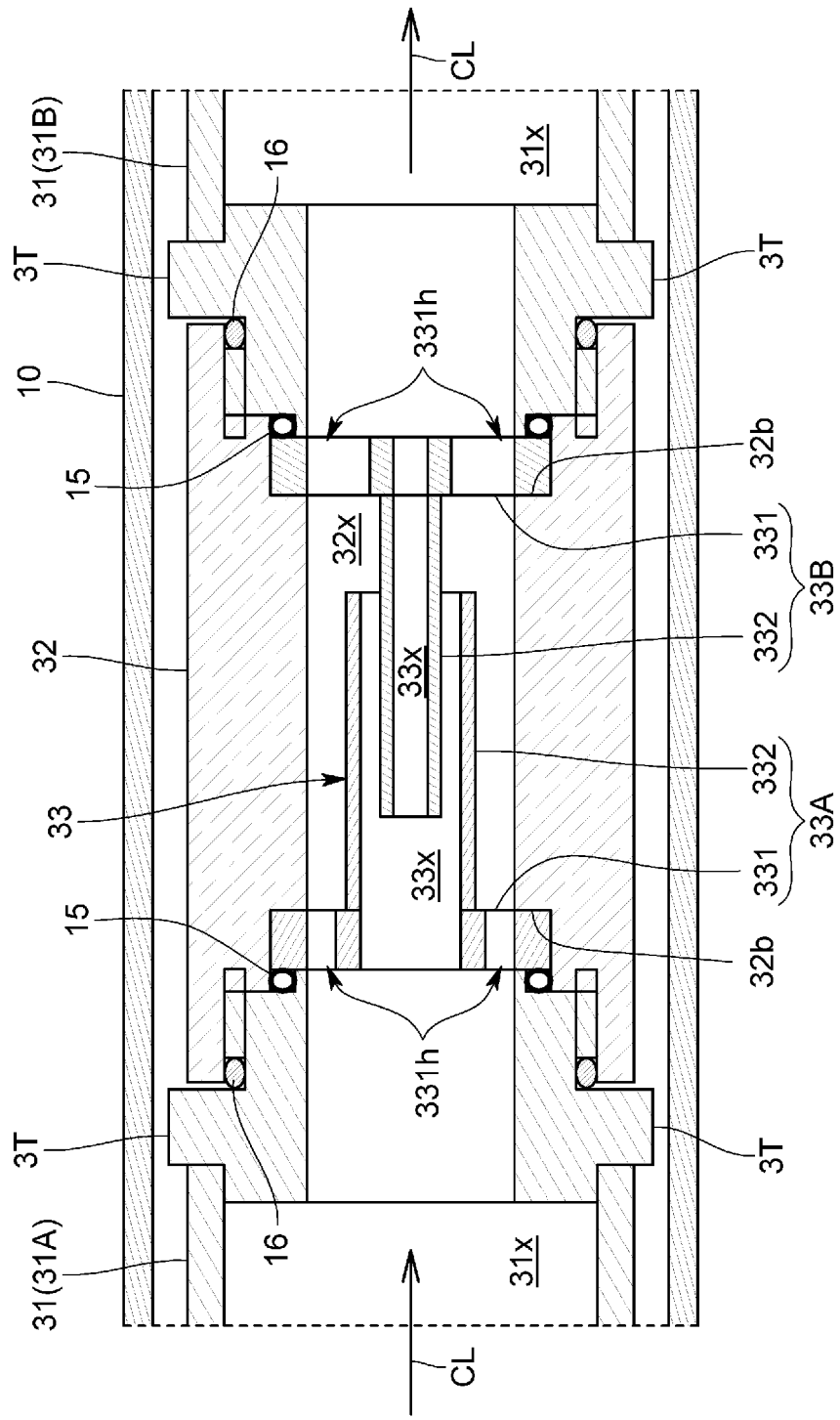
FIG. 11 is an enlarged sectional view which schematically shows the surrounding structure of the capacitance element in the antenna of a variation embodiment.
Figure 12:
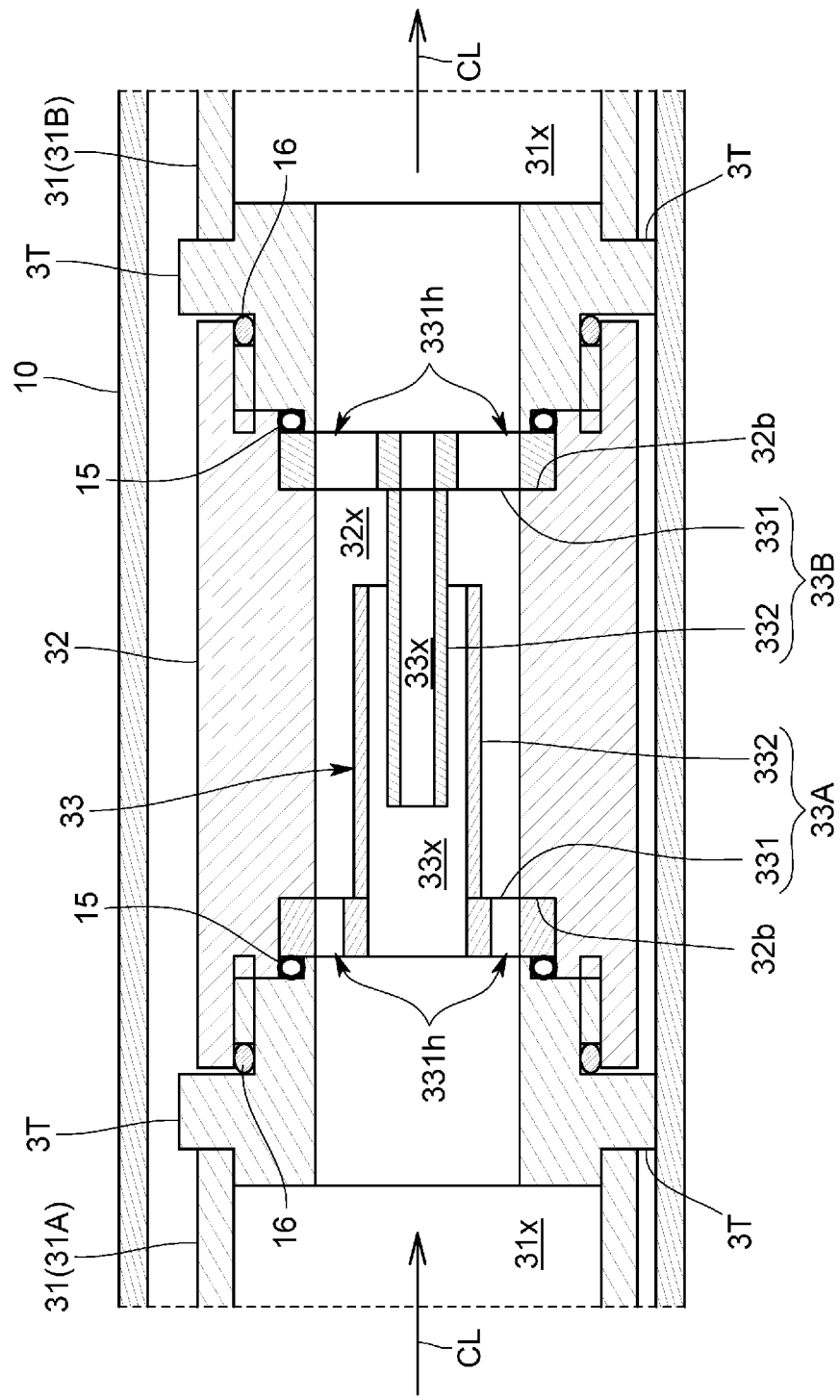
FIG. 12 is an enlarged sectional view which shows a state that a convex portion comes into contact with an insulation cover.

In addition, as shown in FIG. 11, in the outer circumferential surface of the metal pipe 31 or the electrode located on at least one side of two axial sides of the insulation pipe 32 in the antenna 3, a convex portion 3T that protrudes toward the insulation cover 10 may be arranged. Moreover, in FIG. 12, the state that the antenna 3 is bent, that is, the state that lower portions of the convex portions 3T come into contact with the inner surface of the insulation cover 10 is shown.

Moreover, the capacitor 33 shown in FIG. 10 includes the first electrode 33A electrically connected to the first metal pipe 31A on one side of the insulation pipe 32, and the second electrode 33B electrically connected to the second metal pipe 31B on the other side of the insulation pipe 32 and disposed opposing the first electrode 33A, and the space between the first electrode 33A and the second electrode 33B is filled with the cooling liquid CL. That is, the cooling liquid CL that flows in the space between the first electrode 33A and the second electrode 33B becomes the liquid dielectric body constituting the capacitor 33. Each of the electrodes 33A, 33B is substantially formed into a rotor shape, and a flow path 33x is formed in the central portion along the central axis. Specifically, each of the electrodes 33A, 33B has a flange portion 331 that comes into electrical contact with the end portion of the metal pipe 31 on the insulation pipe 32 side, and an extending portion 332 that extends from the flange portion 331 to the insulation pipe 32 side and that is for example cylindrical. The flange portion 331 is sandwiched between the metal pipe 31 and the insulation pipe 32. In addition, through holes 331h through which the cooling water flows are also formed on the flange portion.

Desirably, the convex portions 3T arranged on the antenna 3 are arranged adjoining the two axial sides of the insulation pipe 32. The convex portions 3T are arranged continuously or intermittently across the entire circumferential direction of the members (the metal pipes 31A, 31B in FIG. 11) located on the two axial sides of the insulation pipe 32. Moreover, considering the bending of the antenna 3 due to own weight, the convex portions 3T may be formed only on the lower parts of the metal pipes 31A, 31B. Here, the protruding dimension of the convex portions from the outer circumferential surface of the metal pipe is at a degree that the insulation pipe 32 does not come into contact with the insulation cover 10 due to the bending of the antenna 3. In addition to the rectangular shape as shown in FIG. 11, the sectional shape of the convex portion 3T may be a shape in which at least the leading end portion is arc-like, or be a shape in which at least the leading end portion is triangular.

When a plurality of insulation pipes 32 are arranged in the antenna 3, the convex portions 3T are desirably arranged adjoining the two axial sides of each insulation pipe 32. In addition, the convex portions 3T may be arranged adjoining one axial side of each insulation pipe 32. According to this configuration, when the bending amount of the antenna 3 increases, the plurality of convex portions 3T disposed in the axial direction comes into contact with the insulation cover 10, and the load applied to the insulation cover 10 can be dispersed.

Figure 13:
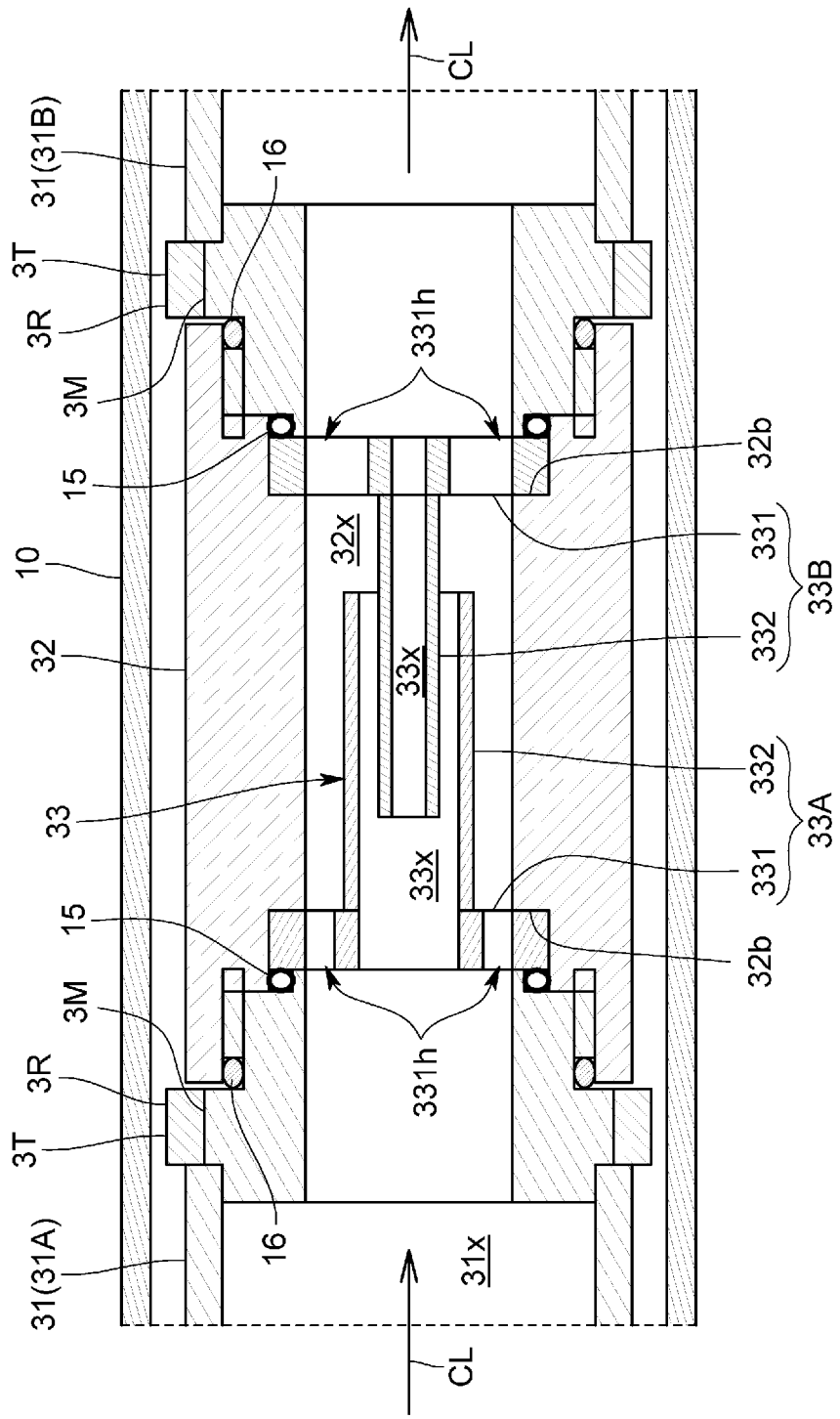
FIG. 13 is an enlarged sectional view which shows a variation example of the convex portion.

Moreover, the positions to arrange the convex portions 3T with respect to the insulation pipe 32 are not limited to positions adjoining the insulation pipe 32, and the convex portions 3T may be arranged on any position as long as the insulation pipe 32 does not come into contact with the insulation cover 10 due to the bending of the antenna 3. Besides, in addition to the configuration of being formed integrally with the metal pipes 31A, 31B, as shown in FIG. 13, the convex portions 3T may also be configured by forming concave portions 3M on the outer circumferential surfaces of the metal pipes 31A, 31B and fitting ring-shape members 3R which become the convex portions 3T into the concave portions 3M.

By arranging the convex portions 3T in the antenna 3 in this way, even when the antenna 3 is bent, the insulation pipe 32 can be prevented from contacting the insulation cover 10 by the contact of the convex portion 3T and the insulation cover 10. Accordingly, thermal damage of the insulation pipe 32 made of resin or the like can be prevented. In addition, by preventing the contact of the insulation pipe 32 and the insulation cover 10, the temperature of the cooling liquid that becomes the dielectric body of the capacitor 33 can be prevented from rising due to the contact of the insulation pipe 32 and the insulation cover 10. As a result, the change in the permittivity of the cooling liquid can be suppressed.

The convex portion 3T can also be arranged in the antenna 3 illustrated in the aforementioned embodiments. In this case, the convex portions 3T is arranged on the member located on at least one side of the two axial sides of the insulation pipe 32 in the aforementioned embodiments (for example, the first metal pipe 31A, the first electrode 33A, the second metal pipe 31B, the contacting portion 331 or the diameter-reduced element 333 of the second electrode 33B).

Figure 14:
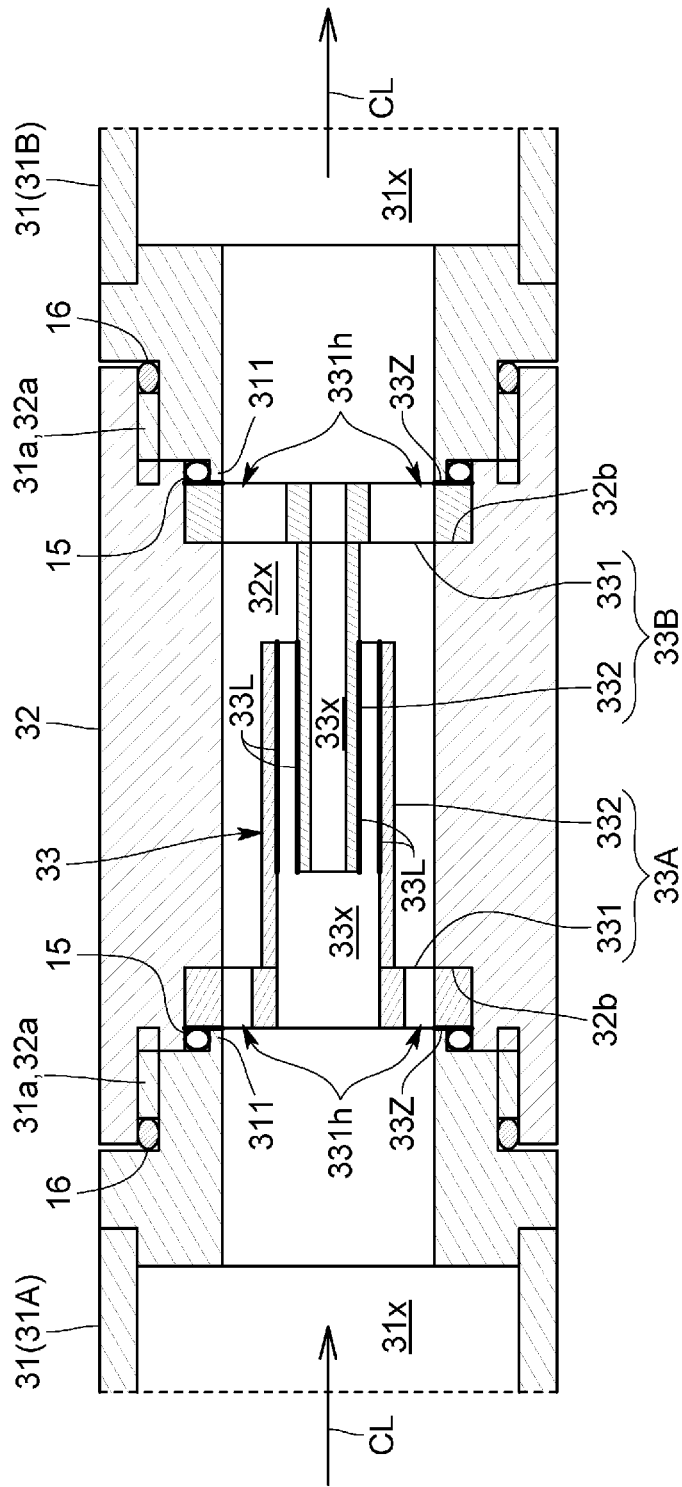
FIG. 14 is an enlarged sectional view which schematically shows the surrounding structure of the capacitance element in the antenna of a variation embodiment.
Figure 15:
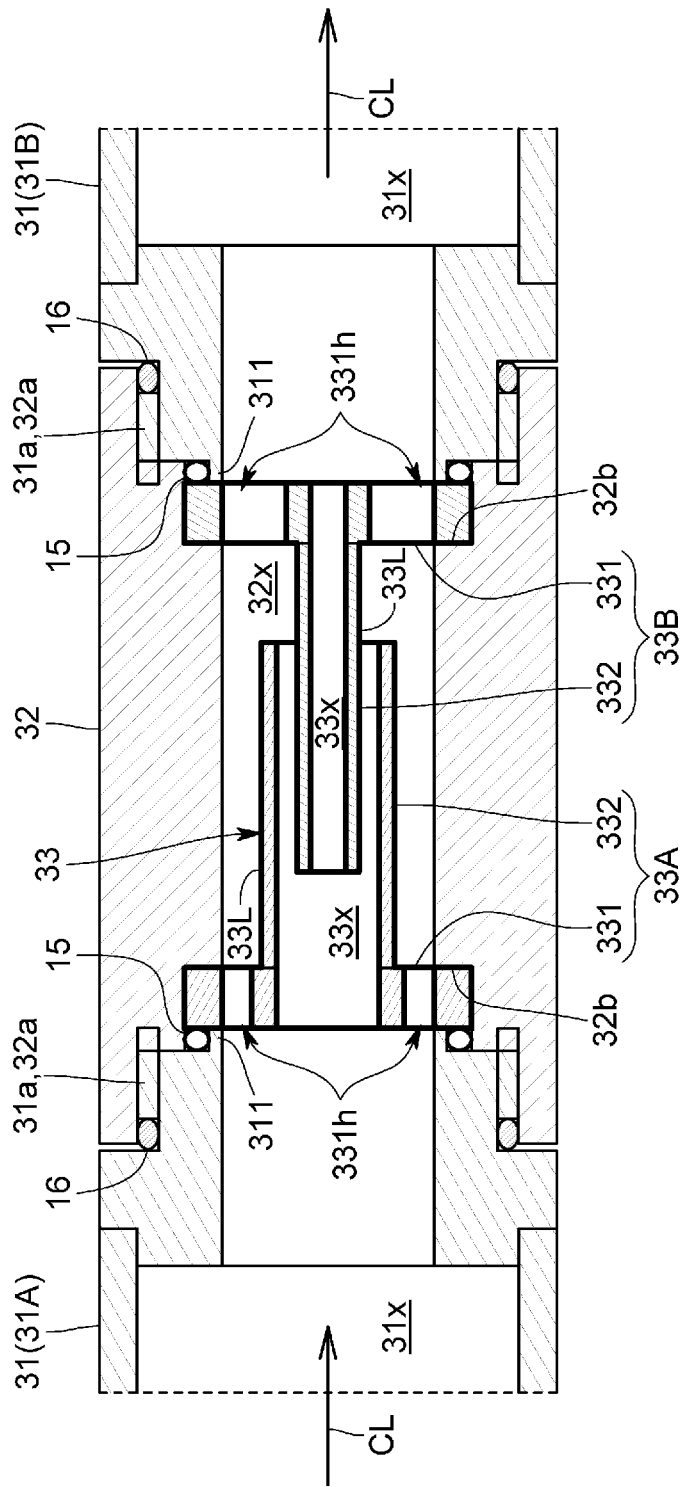
FIG. 15 is an enlarged sectional view which schematically shows the surrounding structure of the capacitance element in the antenna of a variation embodiment.

Desirably, the first electrode 33A and the second electrode 33B have corrosion resistant layers 33L at least on the opposing surfaces of the electrodes. FIG. 14 shows an example in which the corrosion resistant layers 33L are formed on the surfaces opposing each other in the first electrode 33A and the second electrode 33B, and FIG. 15 shows an example in which the corrosion resistant layers 33L are formed on the entire surfaces of the electrodes in the first electrode 33A and the second electrode 33B. Besides, the corrosion resistant layers may be formed on the surface in contact with the cooling liquid in each of the electrodes 33A, 33B. Moreover, in FIG. 14, the corrosion resistant layers 33L are also formed on the contact surfaces 33Z in contact with the metal pipes 31 in each of the electrodes 33A, 33B.

Here, the corrosion resistant layers 33L may be, for example, a plating film such as a nickel plating, or the surface oxide film of the first electrode 33A and the second electrode 33B. The nickel plating is desirably an electroless nickel plating which has no influence on metal grain boundary, has no pinhole and can be plated uniformly to a micro or fine in-tube structure. In addition, when the first electrode 33A and the second electrode 33B are aluminum alloys which are easily oxidized, an oxidation film may be formed on the aluminum alloy and be used as the corrosion resistant layer 33L.

By forming the corrosion resistant layers 33L in this way, the oxidation of each electrode is suppressed and the change in capacitance value over time can be prevented. As a result, the change in impedance of the antenna 3 can be suppressed to maintain the plasma state, and film quality or uniformity of film-forming can be maintained. In addition, because the corrosion resistant layers 33L are also formed on the contact surface 33Z in contact with the metal pipe 31 of each of the electrodes 33A, 33B, resistance change caused by the oxidation of the contacting surface 33Z is suppressed, and the change in impedance of the antenna 3 can be suppressed.

Figure 16:
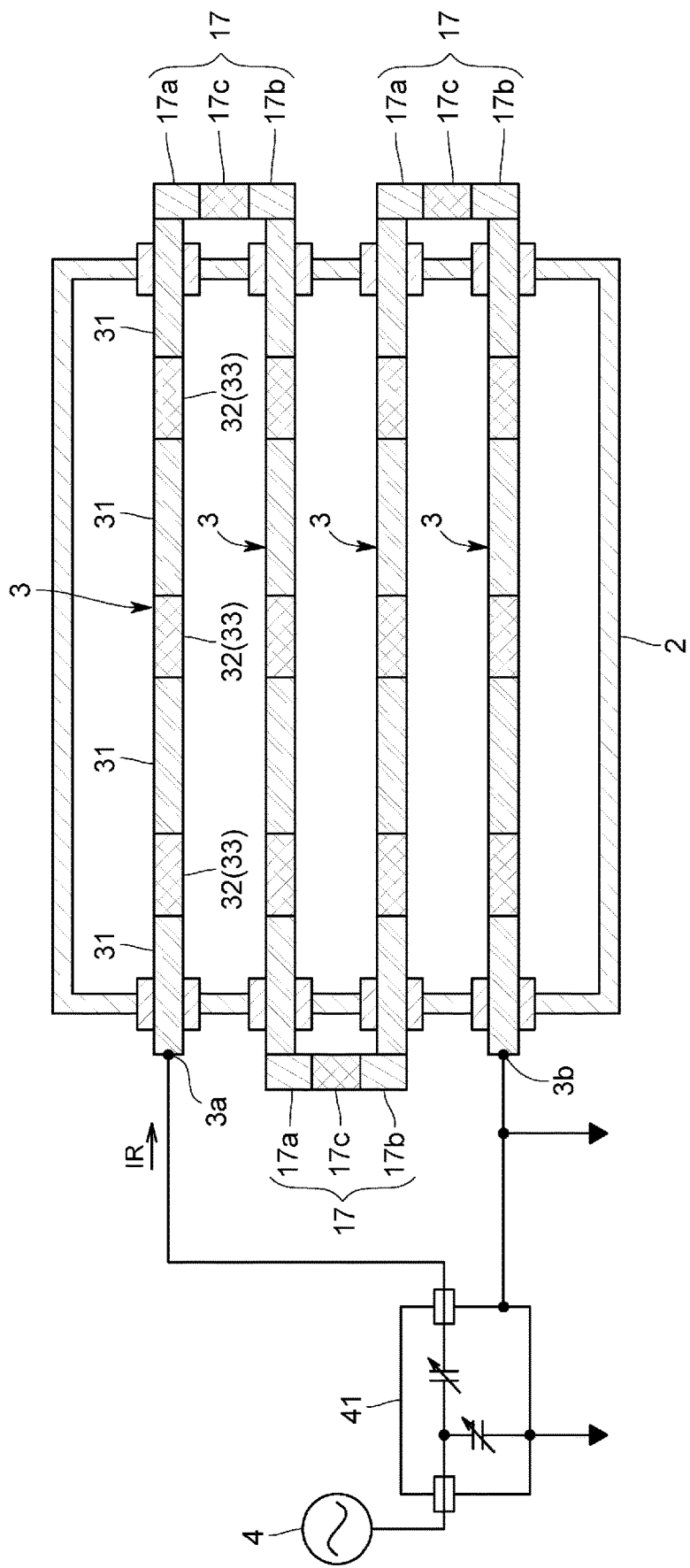
FIG. 16 is a cross-sectional view which schematically shows the configuration of the plasma treatment device of a variation embodiment.

Furthermore, as shown in FIG. 16, in the plasma treatment device 100 having a plurality of antenna 3, two end portions of each antenna 3 may be extended to the outside of the vacuum container 2, and in the mutually adjacent antennas 3, the end portion of one antenna 3 is electrically connected to the end portion of the other antenna 3 by a connection conductor 17. Here, the end portions of two antennas connected by the connection conductor 17 are the end portions located on the same side wall side. Accordingly, the plurality of antennas 4 are configured so that mutually opposite high-frequency currents flow in mutually adjacent antennas 4. By making a plurality of antennas into one antenna structure by the connection conductor 17 in this way, the size of the substrate to be treated can be easily increased.

Besides, the connection conductor 17 has a flow path inside, and the cooling liquid flows in the flow path. Specifically, one end portion of the connection conductor 17 communicates with the flow path of one antenna 3, and the other end portion of the connection conductor 17 communicates with the flow path of the other antenna 3. Accordingly, in the mutually adjacent antenna 3, the cooling liquid flowing through one antenna 3 flows to the other antenna 3 through the flow path of the connection conductor 17. Accordingly, the antenna 3 and the connection conductor 17 can be cooled by a shared cooling liquid. In addition, because the plurality of antennas 3 can be cooled by one flow path, the configuration of the circulation flow path 14 can be simplified.

Furthermore, the connection conductor 17 has one conductor portion 17a connected to one antenna 3 in the mutually adjacent antennas 3, the other conductor portion 17b connected to the other antenna 3, and a capacitor 17c which is a capacitance element connected electrically to and in series with the one conductor portion 17a and the other conductor portion 17b. Moreover, the configuration of the conductor portions 17a, 17b is considered to be similar to, for example, the conductor elements 31 in the aforementioned embodiments, and the configuration of the capacitor 17c is considered to be similar to, for example, the capacitor 33 in the aforementioned embodiments. By arranging the capacitor 17c in the connection conductor 17 in this way, the impedance of the connection conductor 17 can be made to be equal to zero, and an increase in impedance caused by the connection conductor 17 can be eliminated. In addition, the capacitor 17c may a variable capacitor in which the capacitance can be adjusted.

Figure 17:
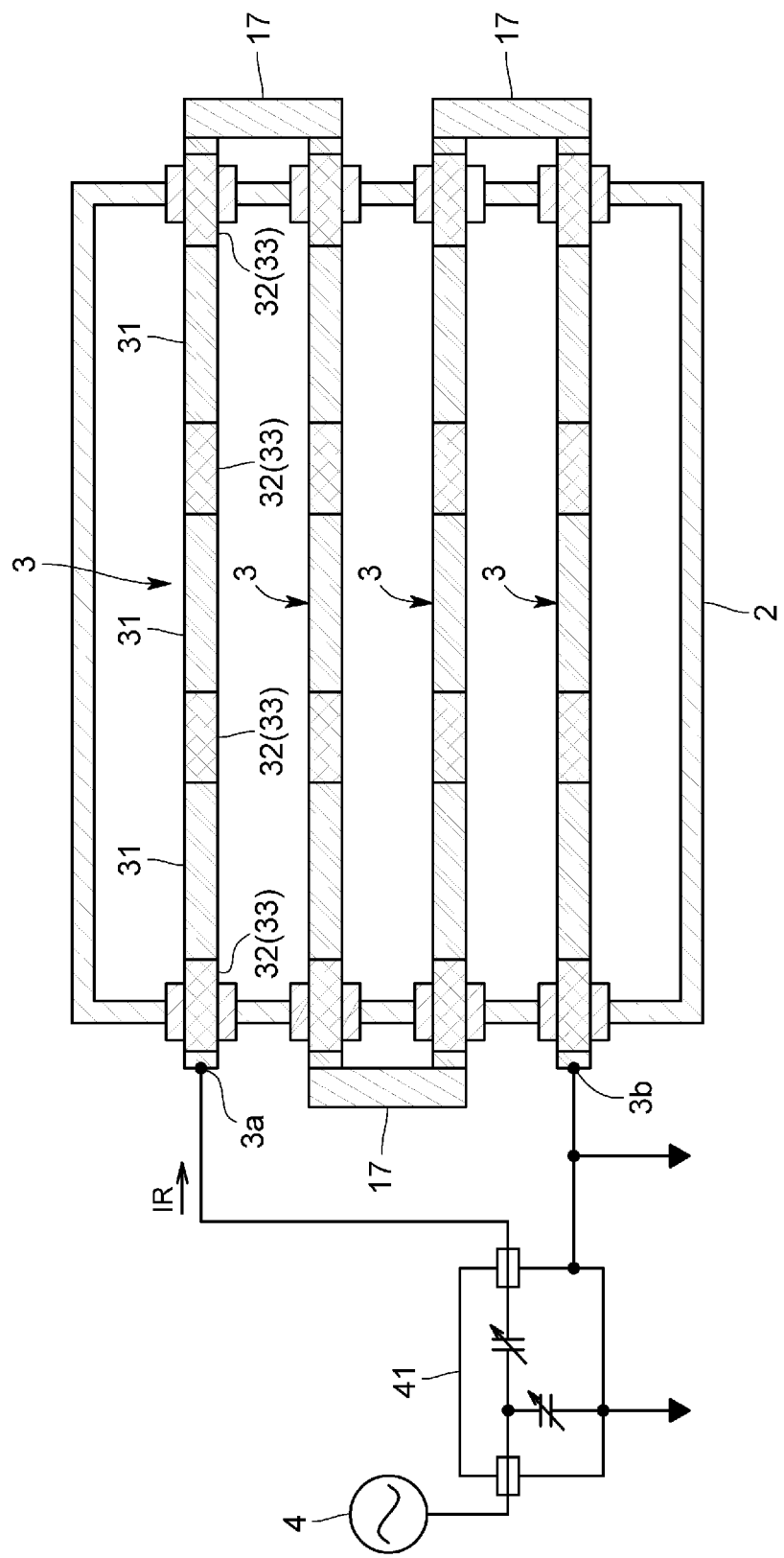
FIG. 17 is a cross-sectional view which schematically shows the configuration of the plasma treatment device of a variation embodiment.

The configuration of the connection conductor 17 is not limited to FIG. 16, and for example as shown in FIG. 17, the connection conductor 17 may be a configuration having no capacitance element. In the case of this configuration, in the mutually adjacent antennas 3, the combined inductance of the power-feeding side end portion 3a of one antenna 3, the grounded side end portion 3b of the other antenna 3 and the connection conductor 17 is made to be equal to the inductance of the other conductor elements 31, and the same inductive reactance and capacitive reactance are repeated continuously across all of the plurality of antennas 3. As a result, for the plurality of antennas 3 as a whole, apparent increase in impedance caused by the connection conductor can be eliminated. As a result, homogenous plasma P can be generated along the antennas 3 in the length direction and the arrangement direction.

Figure 18:
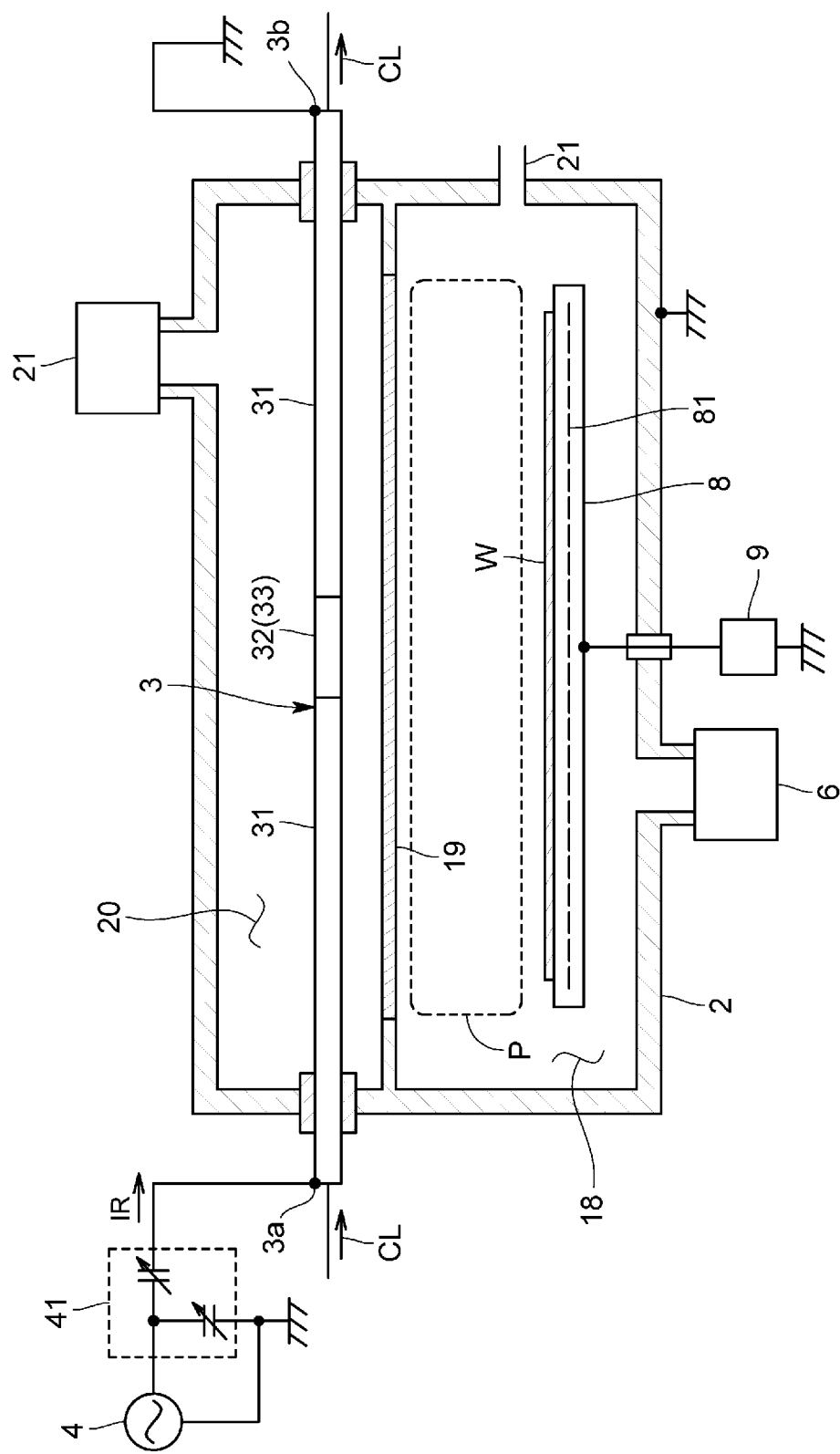
FIG. 18 is a diagram which schematically shows the configuration of the plasma treatment device of a variation embodiment.

In the plasma treatment device 100 of the aforementioned embodiment, the antenna 3 is disposed inside the treatment chamber of the substrate W, but as shown in FIG. 18, the antenna 3 may also be disposed outside a treatment chamber 18. In this case, the plurality of antennas 3 is disposed in an antenna chamber 20 which is divided from the treatment chamber 18 by a dielectric window 19 inside the vacuum container 2. Moreover, the antenna chamber 20 is evacuated by an evacuation device 21. Here, the plurality of antennas 3 may be connected to each other by the connection conductor 17 as shown in FIG. 16 and FIG. 17, or may be individually disposed without being connected by the connection conductor 17. According to this plasma treatment device 100, conditions of the treatment chamber 18 such as pressure and conditions of the antenna chamber 20 such as pressure can be controlled individually, and the plasma P can be generated efficiently and the substrate W can be treated efficiently.

In addition, in the aforementioned embodiments, the antenna is formed into a linear shape, but the antenna may also be curved or bent. In this case, the metal pipe may be curved or bent, and the insulation pipe may be curved or bent.

Additionally, the conductor element and the insulation element are formed into a tubular shape which has one internal flow path; however, the conductor element and the insulation element may also have two or more internal flow paths or have branched internal flow paths. In addition, the conductor element and/or the insulation element may be solid.

In the electrodes of the aforementioned embodiments, the extending portion is formed into a cylindrical shape; however, the extending portion may also be formed into a square cylinder shape, a flat plate shape or a curved or bent plate shape.

Besides, the present invention is not limited to the aforementioned embodiments. Obviously, various changes can be made without departing from the scope of the present invention.

INDUSTRIAL APPLICABILITY

According to the present invention, capacitance elements can be incorporated into the antenna to reduce the impedance of the antenna, and the gaps generated between the electrodes constituting the capacitance element and the dielectric body can be eliminated.

What is claimed is:

1. An antenna through which a high-frequency current flows to generate plasma, comprising:
at least two conductor elements, an insulation element that is arranged between mutually adjacent conductor elements and insulates the conductor elements, and a capacitance element connected electrically to and in series with the mutually adjacent conductor elements; wherein
the capacitance element comprises a first electrode electrically connected to one of the mutually adjacent conductor elements, a second electrode electrically connected to the other of the mutually adjacent conductor elements and disposed opposing the first electrode, and a dielectric body filling a space between the first electrode and the second electrode, and the dielectric body is a liquid, the insulation element is formed into a tubular shape, and the capacitance element is arranged inside the insulation element.

2. The antenna according to claim 1, wherein the conductor elements are formed into a tubular shape, a cooling liquid flows inside the conductor elements and the insulation element, and the cooling liquid is the dielectric body.

3. The antenna according to claim 1, wherein each of the electrodes has a flange portion in electrical contact with an end portion of the conductor element on the insulation element side, and an extending portion that extends from the flange portion toward the insulation element side.

4. The antenna according to claim 3, wherein the extending portion of each of the electrodes is formed into a tubular shape and is arranged coaxially with each other.

5. The antenna according to claim 3, wherein the flange portion of each of the electrodes is fitted into a concave portion formed on a side peripheral wall of the insulation element.

6. The antenna according to claim $1_1$ wherein each of the electrodes has a corrosion resistant layer on at least mutually opposing surfaces of each of the electrodes.

7. The antenna according to claim 6, wherein the corrosion resistant layer is a plating film.

8. The antenna according to claim 6, wherein the corrosion resistant layer is a surface oxide film of the first electrode and the second electrode.

9. A plasma treatment device, comprising:

a treatment chamber which is evacuated and to which a gas is introduced;

the antenna according to claim 1 disposed outside the treatment chamber; and a high-frequency power source that flows a high-frequency current in the antenna; and plasma generated by the antenna is used to perform a treatment on a substrate inside the treatment chamber.

10. The plasma treatment device according to claim 9, wherein a plurality of the antennas is included, and in the mutually adjacent antennas, the end portion of one of the antennas and the end portion of the other of the antennas are electrically connected by a connection conductor, and mutually opposite high-frequency currents flow in the mutually adjacent antennas.

11. An antenna through which a high-frequency current flows to generate plasma, comprising:

at least two conductor elements, an insulation element that is arranged between and insulates a first conductor element and a second conductor element which are mutually adjacent, and a capacitance element connected electrically to and in series with the first conductor element and the second conductor element; wherein the capacitance element comprises:

a first electrode, which is an electrode comprising of a part of the first conductor element or an electrode electrically connected to the first conductor element, and which is disposed nearer to the first conductor element side than the insulation element;

a second electrode, which is electrically connected to the second conductor element, and which extends from the second conductor element side to the first conductor element side through the inside of the insulation element and is disposed opposing the first electrode; and a dielectric body filling a space between the first electrode and the second electrode; and wherein the dielectric body is a liquid.

12. The antenna according to claim 11, wherein the first electrode is formed into a tubular shape, and the second electrode has an extending portion that is inserted into an inner space of the first electrode.

13. The antenna according to claim 12, wherein a distance between an internal circumferential surface of the first electrode and an external circumferential surface of the extending portion is fixed along the circumferential direction.

14. The antenna according to claim $11_1$ wherein each of the conductor elements is formed into a tubular shape, the cooling liquid flowing inside the first conductor element flows into the space between the first electrode and the second electrode to function as the dielectric body, and is introduced into the second electrode from one or a plurality of through hole(s) formed on the second electrode to flow into the second conductor element.

15. The antenna according to claim 14, wherein in the second electrode, one or a plurality of groove(s) which communicates with the through holes and extends along a flow direction of the cooling liquid is formed.

16. A plasma treatment device, comprising:

a vacuum container which is evacuated and into which a gas is introduced;

the antenna according to claim 11 disposed inside the vacuum container or outside the vacuum container; and a high-frequency power source which flows a high-frequency current in the antenna; wherein plasma generated by the antenna is used to perform a treatment on a substrate.

17. The plasma treatment device according to claim 16, wherein a plurality of the antennas is included, two end portions of the antenna extend to the outside of the vacuum container, and in the mutually adjacent antennas, the end portion of one of the antennas and the end portion of the other of the antennas are electrically connected by a connection conductor, and mutually opposite high-frequency currents flow in the mutually adjacent antennas.

18. The plasma treatment device according to claim 17, wherein the connection conductor has a flow path inside and a cooling liquid flows in the flow path.

19. The plasma treatment device according to claim 18, wherein the cooling liquid flows inside the conductor elements and the insulation element, and in the mutually adjacent antennas, the cooling liquid flowing through one of the antennas flows to the other of the antennas through the flow path of the connection conductor.

20. The plasma treatment device according to claim 17, wherein the connection conductor has one conductor portion connected to one antenna in the mutually adjacent antennas, the other conductor portion connected to the other antenna, and a capacitance element connected electrically to and in series with the one conductor portion and the other conductor portion.

21. The plasma treatment device according to claim 16, wherein
an insulation cover that covers the antenna is further included, and
a convex portion that protrudes toward the insulation cover is formed on an outer circumferential surface of at least one of the first conductor element and the second conductor element.

22. The plasma treatment device according to claim 21, wherein the convex portion is continuously or intermittently formed across the entire circumferential direction of the outer circumferential surface.

23. The plasma treatment device according to claim 21, wherein the convex portion is formed in a position adjoining the insulation element in the outer circumferential surface of the first conductor element and the second conductor element.

24. An antenna structure, comprising
the antenna according to claim 11, and
an insulation cover that covers the antenna; wherein
a convex portion that protrudes toward the insulation cover is formed on an outer circumferential surface of at least one of the first conductor element and the second conductor element.

25. An antenna structure, comprising:
an antenna through which a high-frequency current flows to generate plasma; and
an insulation cover that covers the antenna; wherein the antenna comprises at least two conductor elements, an insulation element that is arranged between and insulates a first conductor element and a second conductor element which are mutually adjacent, and a capacitance element connected electrically to and in series with the first conductor element and the second conductor element; wherein
the capacitance element comprises a first electrode electrically connected to one of the mutually adjacent conductor elements, a second electrode electrically connected to the other of the mutually adjacent conductor elements and disposed opposing the first electrode, and a dielectric body filling a space between the first electrode and the second electrode, and the dielectric body is a liquid; and wherein
a convex portion that protrudes toward the insulation cover is formed on an outer circumferential surface of at least one the first conductor element and the second conductor element.

* * * * *